(12) United States Patent
Marion et al.

(10) Patent No.: US 6,201,248 B1
(45) Date of Patent: Mar. 13, 2001

(54) DEVICE AND PROCESS FOR READING A MATRIX OF PHOTONIC DETECTORS

(75) Inventors: Dominique Marion, Grenoble; Eric Mottin, St Martin le Vinoux; Philippe Pantigny, Claix, all of (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 09/117,549

(22) PCT Filed: Dec. 12, 1996

(86) PCT No.: PCT/FR96/01990

§ 371 Date: Jul. 31, 1998

§ 102(e) Date: Jul. 31, 1998

(87) PCT Pub. No.: WO98/26455

PCT Pub. Date: Jun. 18, 1998

(51) Int. Cl.[7] ............................ H01L 27/146; H04N 3/15
(52) U.S. Cl. ......................................... 250/370.08
(58) Field of Search ........................................ 250/370.08

(56) References Cited

U.S. PATENT DOCUMENTS 4,942,474   7/1990   Akimoto et al. .
5,184,018   2/1993   Conrads et al. .
5,742,058 * 4/1998   Pantigny et al. ................. 250/370.08

OTHER PUBLICATIONS

Proceedings of the IEDM, Dec. 5–8, 1993, pp 93–583 to 93–585 , Mendis, S.K., et al, "A 128 ×128 CMOS Active Pixel . . . ".

Japanese J. Appln. Phys., 32(1A), pp. 198–204 (Jan. 1993), Fujieda, I., et al, "High Sensitivity Readout . . . ".

Proceedings of IEEE in Israel, Tel–Aviv, Mar. 7–9, 1989, pp. 1–4 (1989) Kepten, A., et al "InSbMonolithic . . . ".

* cited by examiner

Primary Examiner—Constantine Hannaher
(74) Attorney, Agent, or Firm—Anderson, Killer & Olick P.C.

(57) ABSTRACT

A method and a device are provided for reading a matrix of photonic detectors which delivers a current whose intensity varies according to the incident flux. A set of elementary points (PEL(i,j)) enables the signals delivered by each detector to be read. The quantity processed is the charge. Each elementary point effects a preintegration of the current delivered by a corresponding detector. A charge amplifier effects a reading to condition the signals delivered by the matrix of detectors and to multiplex them to at least one information processing chain.

18 Claims, 14 Drawing Sheets

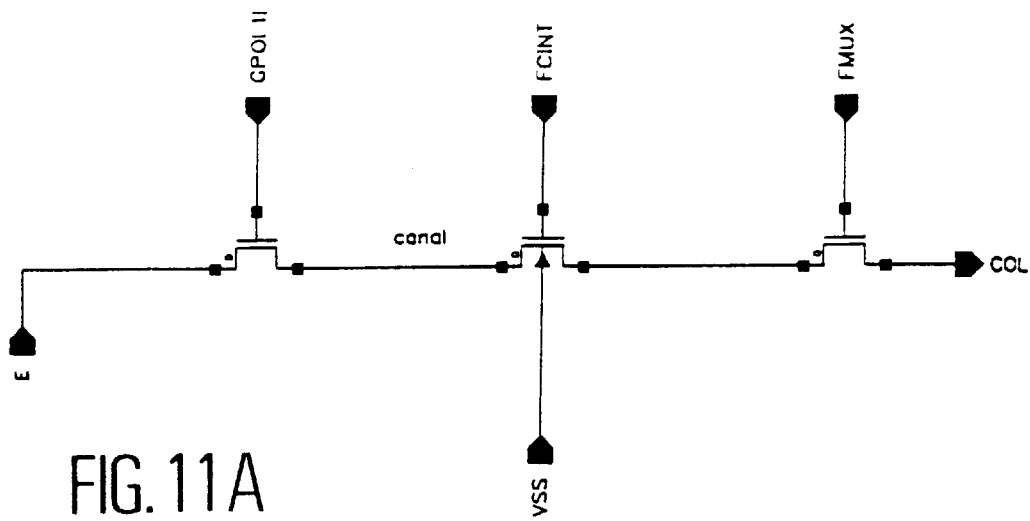
FIG. 11A
FIG. 11B
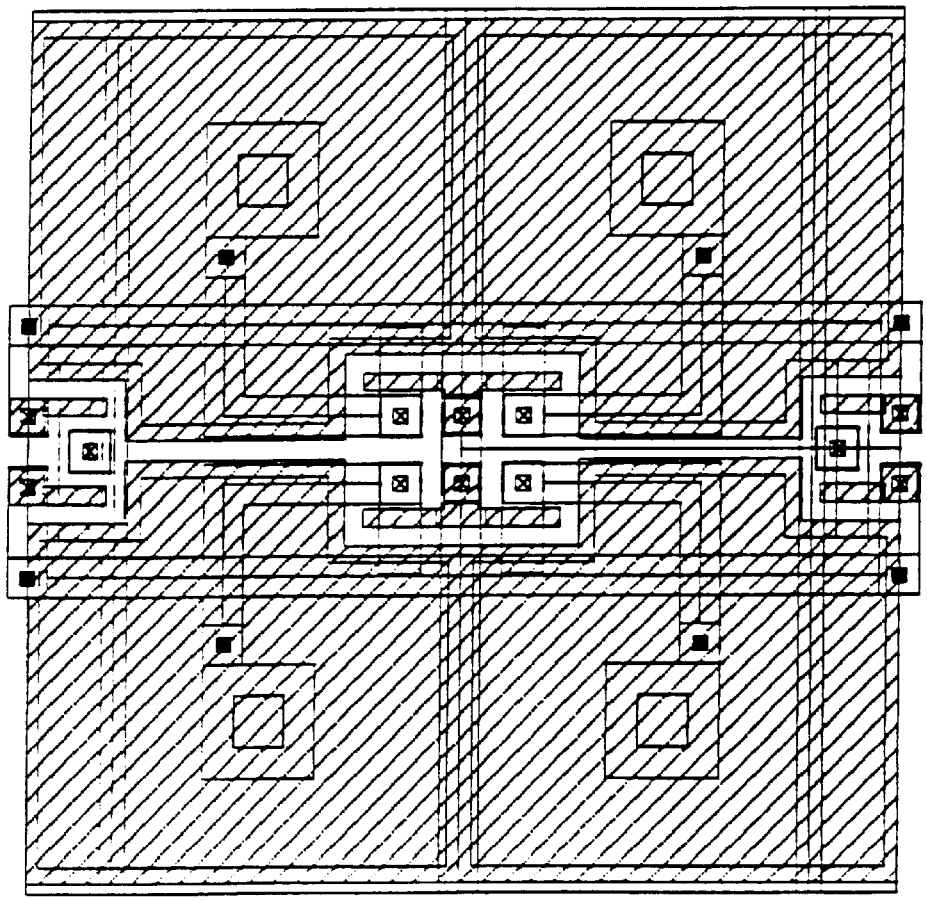

DEVICE AND PROCESS FOR READING A MATRIX OF PHOTONIC DETECTORS

DESCRIPTION

1. Technical Field

The present invention relates to a device for reading a matrix of photonic detectors.

2. Prior Art

The photonic detection devices to which the invention relates are of two types:

quantal;

thermal.

In quantal detectors, the photons received by the detector are converted into electrons and/or holes according to the detection principle, which may be intrinsic (direct transition from valence band to conduction band) or extrinsic (transition between intermediate level and conduction band). Quantal detectors can be grouped into two categories:

photovoltaic detectors, whose current intensity varies according to the incident flux;

photoconductive detectors, whose resistance varies according to the incident flux.

Thermal detectors can be grouped into two categories:

resistive bolometric detectors, whose resistance varies according to the energy of the incident radiation;

diode detectors, whose current intensity varies according to the incident flux.

Quantal detectors and thermal detectors can each be assimilated to a current generator, more or less ideal, which delivers a current whose intensity varies according to the incident flux, by means of which these detectors are suitably biased.

In cameras of interest for the invention, images are produced either using linear arrays of detectors, in other words detectors located at a regular pitch in a single direction, which must be scanned, or using mosaics or matrices, in other words detectors located in a matrix, which are not scanned in the majority of cases.

Having regard to the number of detectors used in current cameras, and having regard to the pitch between detectors, it is absolutely necessary to use a specific circuit, which will hereinafter be referred to as a read circuit, for conditioning the signal delivered by the detector and multiplexing it to a small number of information processing chains.

Each detector can be implemented either directly on the read circuit or on another circuit. In the first case a monolithic component is spoken of and in the second a hybrid component since the detectors of the detection circuit are interconnected to the input stages of the read circuit by suitable technologies such as ball hybridization.

The invention relates to a read circuit architecture which is particularly suited to the reading of mosaics of:

quantal detectors implemented on a substrate other than that of the read circuit and, consequently, hybridized to this read circuit ;

thermal detectors implemented directly on the read circuit.

A description will now be given of several read circuits of the prior art.

Read Circuits of the Charge Transfer Device Type

Read circuits of the charge transfer device type are manufactured in specific networks enabling charge transfer devices to be implemented.

An outline diagram of these circuits is given in FIGS. 1A and 1B.

In each elementary point depicted in FIG. 1A there are found:

a switch or impedance matching device AI between a detector and an MOS capacitor;

an MOS capacitor Cpel ("Design of MOS integrated circuits" published by Eyrolles) whose inversion channel is used as a storage site;

a switch which makes it possible to control the injection of the charges stored in the elementary point into the channel of a charge transfer register;

a reset device (RAZ) for the storage site.

The multiplexing of the charges stored in the elementary points to one or more outputs is effected by means of two types of charge transfer register:

parallel registers RPj which multiplex the elementary points from a column to an input of the serial register;

the serial register or registers RS which multiplex the charges coming from the parallel registers to the output stage or stages of the read circuit.

At each frame, the inversion channel of the integration capacitor is emptied of all charge by means of the reset device. The current output by each detector in the mosaic is then integrated during the exposure time in the inversion channel of the integration capacitor.

The integrated charge $Qpel_{ij}$ in the storage capacitor Cpel of the elementary point PEL(i,j) is related to the intensity $Id_{ij}$ of the current output by the detector DET(i,j) and to the exposure time by the equation:

$$Qpel_{ij} = Id_{ij} \times Texposure$$

All or part of the charge stored in each of these integration capacitors is then taken off by means of different techniques and multiplexed by means of charge transfer devices to one or more output stages. It is in the output stage that the charges are converted into voltage by injection into a suitably biased capacitor. The voltage at the terminals of this capacitor is read by a voltage amplifier with a very high input impedance and a low output impedance.

The expression of the amplitude $\delta Vs_{ij}$ of the output voltage pulse, corresponding to a reading of the elementary point PEL(i,j), is given by the expression:

$$\delta Vs_{ij} = Aq \times Id_{ij} \times Texposure / Cs$$

where Cs is the charge voltage conversion factor of the output stage and Aq the charge gain of the circuit.

These read circuits have the advantage of having an identical and synchronous exposure time for all the detectors.

On the other hand, they are not compatible with a random addressing of the detectors, which prevents the production of sub-images.

The reset device is absolutely necessary only if the entire integrated charge cannot be transferred into the parallel register.

Finally, these read circuits have the major drawback of having to be implemented in specific networks whose integration density is lower than that of conventional CMOS networks whereas the pitch of the detector mosaics is greatly reduced.

Read Circuits of the Switched Follower Type

For read circuits of the switched follower type described notably in references [1], [2] and [3] cited at the end of the description, an outline diagram is given in FIGS. 2A and 2B.

At the minimum, there are found in each elementary point depicted in FIG. 2A:

a switch or impedance matching device AI between a detector DET(i,j) and an integration capacitor;

a capacitor Cpel implemented by means of an MOS transistor whose gate-source capacitance makes it possible to convert the current into voltage by integration;

a switch for reinitialising the integration capacitor at each frame, implemented by means of MOS transistors;

a voltage amplifier Apel with high input impedance which makes it possible to read the voltage at the terminals of the integration capacitor and to drive an output amplifier at low impedance;

a switch which makes it possible to switch the output of the amplifier of the elementary point onto a connection common to the elementary points in one and the same column, referred to as the column bus BCj.

The multiplexing of the column buses BCj to one or more output amplifiers As is effected by means of switches located at the ends of each column bus.

At each frame, the voltage at the terminals of the integration capacitor is first of all reinitialised by means of the reset switch. The detector current is then integrated in the integration capacitor for a period of time Texposure. At the end of the integration time, the output of the amplifier of the elementary point is switched onto the column bus and onto the output amplifier by means of the suitably sequenced switches of the elementary point and of the line multiplexer.

The expression of the voltage variation, $\delta Vpel_{ij}$, at the terminals of the integration capacitor of the elementary point PEL(i,j) as a function of the current $Id_{ij}$ of the detector DET(i,j) of this elementary point is given by the expression:

$$\delta Vpel_{ij} = Id_{ij} \times Texposure/Cpel$$

where Cpel is the capacitance of the storage capacitor of the elementary point.

The variation in the output voltage $\delta Vpel_{ij}$ corresponding to the reading of the elementary point PEL(i,j), is given by the equation:

$$\delta Vs_{ij} = Apel \times As \times \delta Vpel_{ij} = Apel \times As \times Id_{ij} \times Texposure/Cpel$$

where Apel (or respectively As) is the voltage gain of the voltage amplifier of the elementary point (or respectively of the output amplifier).

This type of circuit architecture has the advantage of being compatible with a random addressing of the elementary points, or in other words the production of sub-images.

A first limitation is related to the detector read mode. This is because, where the exposure time must be identical and synchronous for all the detectors, it is necessary to sample and hold the voltage at the terminals of the storage capacitor in the elementary point. This function therefore imposes additional constraints in the design of the elementary point, and the smaller the pitch of the elementary point, the more difficult it will be to meet these. In particular, the surface area of the storage capacitor, and therefore its capacitance, decreases. The reduction in the storable charge then results in a degradation of the signal to noise ratio.

Another limitation of this type of architecture is related to the reading rate, which imposes sizing constraints on the voltage amplifier of the elementary point and on the switch which affords a connection between the outputs of elementary points in one and the same column to the output amplifier. This is because the time taken to establish the signal output from the amplifier of the elementary point must be less than the output period of the video signal. In practice it is necessary:

for the amplifier of the elementary point to be capable of supplying a high current, for the resistance of the switch to be sufficiently low so as not significantly to reduce the voltage gain of the amplifier;

for the capacitive coupling due to the dividing point between the input-output capacitance of the amplifier of the elementary point and the storage capacitance to be such that the sample and hold voltage at the input of the amplifier of the elementary point is not significantly changed.

These constraints become all the more difficult to satisfy as the number of detectors increases and the pitch of the elementary points decreases whilst the image rate remains constant and the number of outputs rather has a tendency to decrease.

Finally, it is absolutely necessary to integrate into the elementary point a specific device for fulfilling the reset function for the elementary point, which requires at least one additional transistor.

Read Circuits of the Column Bus Partition Type

For read circuits of the column bus partition type, an outline diagram is given in FIGS. 3A and 3B.

At a minimum, there are found in each elementary point depicted in FIG. 3A:

a switch or an impedance matching device AI between a detector DET(i,j) and an integration capacitor;

a capacitor Cpel whose capacitance, either that of the inversion channel of an MOS capacitor, or the gate-source capacitance of an MOS transistor, makes it possible to convert the current into voltage by integration;

a switch which makes It possible to switch a terminal of the integration capacitor of the elementary point onto a connection common to the elementary points of one and the same column, referred to as a column bus BCj.

A voltage amplifier Abc with high input impedance but low input capacitance is located at the end of each column bus BCj, along with a switch for resetting the integration capacitors.

The multiplexing of the outputs of these voltage amplifiers to one or more output amplifiers As is effected by means of switches located at the output of each of these amplifiers.

The multiplexing of the outputs of these voltage amplifiers to one or more output amplifiers is effected by means of switches located at the output of each of these amplifiers.

At each frame, the detector current is integrated in the integration capacitor for a period of time Texposure. At the end of the integration time, a line is selected and the switches of the elementary points of this line are closed on the interconnection buses, which were previously suitably initialised. The system formed by the storage capacitor and the column bus being isolated, the final voltage of the column bus is a function of its capacitance and of the storage capacitance. As soon as this voltage is stabilised, the output voltage of the column amplifiers is multiplexed to the output amplifier or amplifiers. It is then possible to reinitialise the integration capacitor for the same line by means of the reset switches situated at the end of each column bus.

The charge $Qpel_{ij}$ integrated in the elementary point PEL(i,j) as a function of the current $Id_{ij}$ of the detector of this elementary point and of the exposure time Texposure is given by the expression:

$$Qpel_{ij}=Id_{ij}\times Texposure$$

The variation in voltage $\delta Vbc_{ij}$ of the column bus after switching of the capacitor of the elementary point PEL(i,j) is obtained by writing the charge conservation equation (it is assumed here that the initial charge on the column bus is nil):

$$\delta Vbc_{ij}=Qpel_{ij}/(Cpel+Cbc)=Id_{ij}\times Texposure/(Cpel+Cbc)$$

where Cpel (or respectively Cbc) is the capacitance of the storage capacitor in the elementary point (or respectively the capacitance of the column bus).

The variation in output voltage $\delta Vbc_{ij}$ corresponding to the reading of the information delivered by the elementary point PEL(i,j) is given by the following equation:

$$\delta Vs_{ij}=As\times Abc\times\delta Vbc_{ij}=As\times Abc\times Id_{ij}\times Texposure/(Cpel+Cbc)$$

where Abc (or respectively As) is the voltage gain of the voltage amplifier of a column bus (or respectively of the output amplifier).

The advantages and drawbacks of this architecture are almost the same as those of the structure with switched followers, with the only difference that the drawbacks related to the presence of the amplifier disappear. As for the resetting of the elementary point, it is not absolutely necessary to install a specific device in the elementary point since it is possible to reinitialise the integration capacitor via the column bus.

It is however necessary for the user to adapt to the reduction in gain due to the attenuation of the signal controlled by the value of the capacitance of the column bus. This point may be prohibitive in terms of signal to noise ratio for circuits of large size, and therefore with a high Cbc, and/or for applications where the charge to be manipulated is small.

Read Circuits of the Remote Integration Type

For read circuits of the remote integration type, as described notably in the references [4] and [5] cited at the end of the description, an outline diagram is given in FIGS. 4A and 4B.

In each elementary point there is found at a minimum, since the impedance matching device AI is not always absolutely necessary, a switch which makes it possible to switch the detector DET(i,j) onto a connection common to the elementary points of one and the same column, referred to as a column bus BCj. Then, at the end of each column, a charge amplifier Ac is found, that is to say a voltage amplifier with feedback through a capacitor.

The multiplexing of the outputs of these charge amplifiers Ac to one or more output amplifiers As is effected by means of switches located at the output of each of these charge amplifiers.

At each frame, the lines of detectors are selected one after the other. At the required moment, the detectors of the addressed line are switched onto the column buses by closing the switches located in the elementary points of the line under consideration, for a period of time equal to the exposure time (Texposure).

The current $Id_{ij}$ delivered by the detector DET(i,j) is integrated during Texposure by the charge amplifier connected to the column bus BCj. At the end of the exposure time, the output voltage of the charge amplifier is read by the acquisition chain. Another line can then be selected after the charge amplifiers have been suitably reinitialised.

The output voltage variation $\delta Vc_{ij}$ of the charge amplifier Acj onto which the detector DET(i,j) was switched is given by the formula:

$$\delta Vc_{ij}=Id_{ij}\times Texposure/Ca$$

where Ca is the capacitance of the feedback capacitor of the charge amplifier.

The variation in output voltage $\delta Vs_{ij}$ corresponding to the reading of the information delivered by the elementary point PEL(i,j) is given by the following equation:

$$\delta Vs_{ij}=As\times\delta Vc_{ij}=As\times Id_{ij}\times Texposure/Ca$$

where As is the voltage gain of the output voltage amplifier.

This architecture requires only one switch per elementary point, and hence its field of application in mosaics with reduced pitch. In particular a reset switch is not essential in the elementary point.

On the other hand, it is clear that this type of architecture is not compatible with an identical and synchronous exposure time for all the elementary points.

Moreover, this architecture imposes a constraint on the exposure time, which must be less than or equal to the period of the video output signal divided by the number of lines to be read. This constraint limits the signal to noise ratio of this type of read circuit for applications with a large number of points and with a small number of outputs.

The problem is to design an elementary point which makes it possible to read the signal delivered by a mosaic of quantal detectors or thermal detectors, knowing that the following are necessary:
an identical and synchronous exposure time for all the detectors in the mosaic (this characteristic of shooting will be referred to hereinafter as snapshot);
maximising the charge which can be stored in the elementary point in order to have an optimum signal to noise ratio.

In order to mitigate the drawbacks of the read circuits of the prior art reviewed above, the object of the present invention is an architecture in which the electrical quantity processed by the read circuit is neither the current nor the voltage, but the charge, by preintegration in the elementary point of the current delivered by the detector, as in a solution of the charge transfer device type, and then by reading of this charge by a charge amplifier, as in remote integration circuits.

DESCRIPTION OF THE INVENTION

The present invention concerns a device for reading a matrix of photonic detectors which delivers a current whose intensity varies according to the incident flux, the exposure time being identical and synchronous for all the detectors, characterised in that it comprises a set of elementary points for reading the signals delivered by each detector, in that the quantity processed is the charge, each elementary point effecting a preintegration of the current delivered by a corresponding detector. A reading of the resulting quantity of charges by a charge amplifier is effected, so as to condition the signals delivered by the matrix of detectors and to multiplex them to at least one information processing chain. The charge amplifier is external to the elementary point in the case of a matrix of detectors. In the case of a linear array of detectors, the charge amplifier is situated either outside or inside the elementary point.

Advantageously, the photonic detectors are quantal detectors or thermal detectors. They are implemented on a substrate other than the said reading device, or directly on the circuit of the reading device.

Advantageously each elementary point comprises:
an impedance matching device;
a charge integration, storage and discharge device;
an addressing device.

The impedance matching device is situated between the detector under consideration and the storage device. The storage device is implemented by means of at least one MOS transistor whose source and/or drain are connected to the detector via a switch and whose gate is controlled by a clock. The addressing device makes it possible to switch the source and/or drain of the MOS storage transistor onto a connection common to the elementary points of one and the same column, referred to as a column bus. The charge amplifier is connected to the end of each column bus and the multiplexing of the outputs of the charge amplifiers to at least one output amplifier is effected by means of at least one switch.

Advantageously the impedance matching device is an MOS transistor. The addressing device is an MOS transistor used as a switch, the analogue level applied to its gate in order to make it conducting is such that the absolute value of the gate-source potential difference is slightly greater than the absolute value of the threshold voltage of the MOS transistor.

Advantageously the time taken for establishing the output signal of the charge amplifier is less than the fall time of the clock which controls the gate of the transistor. In the case of a linear array of detectors either there is a common connection and a single charge amplifier, or there is no common connection and as many charge amplifiers as there are lines in the array, the multiplexing being limited to the multiplexing of the charge amplifiers.

Advantageously the charge amplifier comprises:
an input preamplifier;
a feedback capacitor whose capacitance is equal to the maximum charge to be read divided by the output voltage excursion of the amplifier;
a differential amplifier whose gain x band product is adapted to the rise time of the current pulse which is injected into the bus.

Advantageously each elementary point consists of:
an impedance matching device, provided with a first clock, suitable for biasing the corresponding detector and for reading the current supplied by this detector;
at least one MOS transistor, provided with a second clock able on the one hand to integrate the current supplied by the detector and on the other hand, associated with an addressing device, to store the charge obtained;
the addressing device, provided with a third clock, suitable for switching the source and/or drain of the MOS transistor onto a common connection of the elementary points of one and the same column, referred to as a column bus.

Advantageously, in each elementary point, the impedance matching device is connected by its input to the detector, by its output to the source and/or to the drain of this MOS transistor and by its control to a first clock which switches between the switching-off voltage and a bias voltage Vbias. The gate of the MOS transistor is connected to a second clock which switches between a voltage which makes it possible to store the charges and a voltage which enables the stored charge to be discharged onto a common connection. Advantageously the voltage which makes it possible to store the charges is earth for an NMOS transistor and is equal to the bias voltage for a PMOS transistor. The addressing device is connected, by its input, to the vacant connection (source or drain) of the MOS transistor, by its output to the column bus and by its control to a third clock which switches between earth and the bias voltage Vscreen. The charge amplifier is connected at its input to the addressing devices, via the column bus, and at its output to the video follower.

The present invention also relates to a method of reading a matrix of photonic detectors, which delivers a current whose intensity varies according to the incident flux, characterised in that it comprises the following steps:
converting the detector current into a charge by an integration of duration equal to the exposure time;
converting the integrated charge into a current pulse whose amplitude is adjustable according to a stimulus and whose duration varies according to the stored charge;
converting this current pulse into a voltage by means of an amplifier with feedback through a capacitor.

Advantageously it includes the following steps:
The first clock Hp being at the level of the bias voltage Vbias, the second HCi (i is the line number) being at the level enabling the charges to be stored and the third at the switching-off voltage: once per image, integration of the current supplied by the detector in the MOS transistor (storage) for a time predefined according to the scene lighting conditions, the characteristics of the detector and the value of the storage capacitance.
The first clock Hp returning to its switching-off voltage; the second clock HCi varying linearly from the level enabling the charges to be stored to the level switching off the transistor (the rate of variation being determined with respect to the characteristics of the amplifier); and the third clock HAi switching to the level Vscreen; a step of discharging the charges performed for each line of the matrix; the second clock HCi being at the switching-off voltage; the third clock HAi switching to the switching-off voltage, and the procedure is recommenced for the following line.
All the lines have been scanned, the above steps are recommenced for another image.

The invention makes it possible to simplify the electronics of a read circuit by eliminating the reset devices present in the elementary points even in the devices of the prior art. This function is nevertheless kept but is performed by a charge amplifier external to the elementary point except in one of the particular cases of the linear array of detectors where the amplifier is situated within the elementary point.

In the invention, the following are of interest for a line:
multiplexing of this line onto the column buses;
multiplexing of the amplifiers, as many times as there are lines.

The charge can be stored on the MOS storage transistor only for particular positions of the first two clocks with respect to each other, at a predetermined level.

The clock which controls the gate of the storage transistor is controlled between earth and the maximum voltage applied to the read circuit. In the case of an NMOS transistor the falling edge must be compatible with the characteristics of the pass band of the charge amplifier, whilst in the case of a PMOS transistor the rising edge must be compatible with the characteristics of the pass band of the charge amplifier.

The advantages of the invention are as follows:
firstly the operating frequency of the imager is limited solely by the sizing of the video follower, whilst in the devices of the prior art the follower of the elementary point also limits the operating frequency;

secondly, with a view to increasing the formats of the imagers, it is necessary to increase the number of detectors whilst reducing the size of the elementary point and their spacing; and finally, the invention makes it possible to implement read circuits with a CMOS technology which has the particularity of affording both high integration density and random reading of the detectors, unlike the devices of the prior art implemented with a CCD technology.

BRIEF DESCRIPTION OF THE DRAWINGS

FIGS. 10A and 10B and 11A and 11B illustrate the layout and electrical diagram of a mosaic of two lines by two columns of elementary points, respectively for a read circuit of the prior art of the switched follower type and for a read circuit according to the invention;

DETAILED DESCRIPTION OF EMBODIMENTS

Figure 1A:
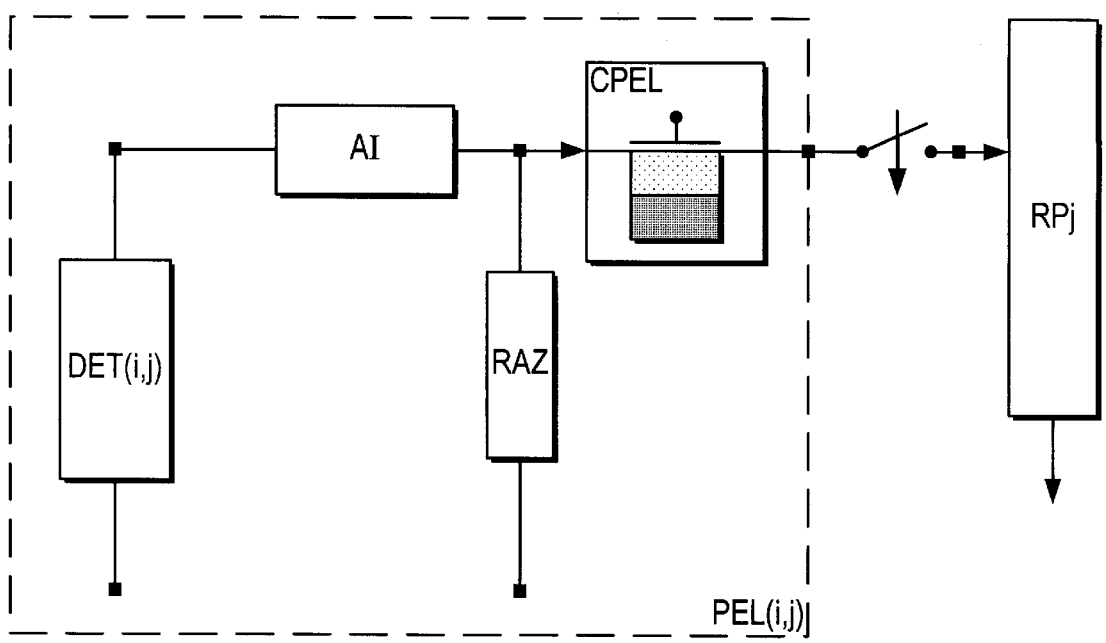
FIGS. 1A and 1B illustrate a read circuit architecture of the prior art of the charge transfer type.
Figure 1B:
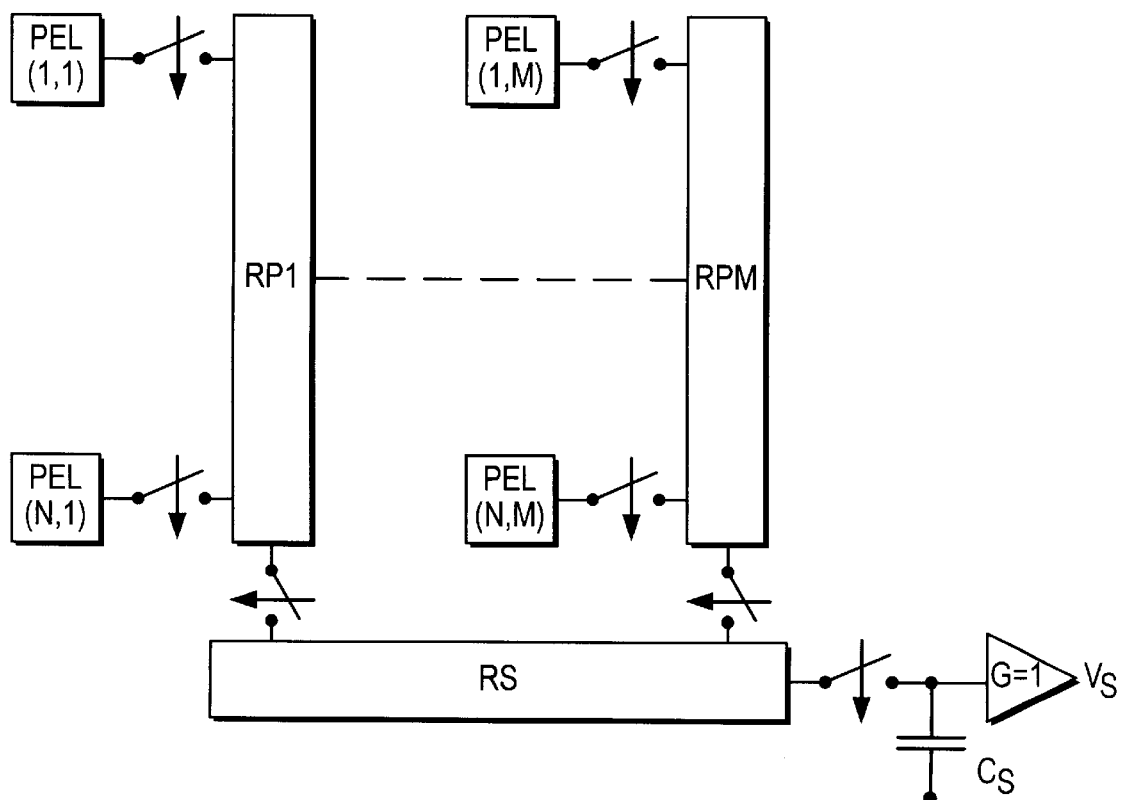
Figure 2A:
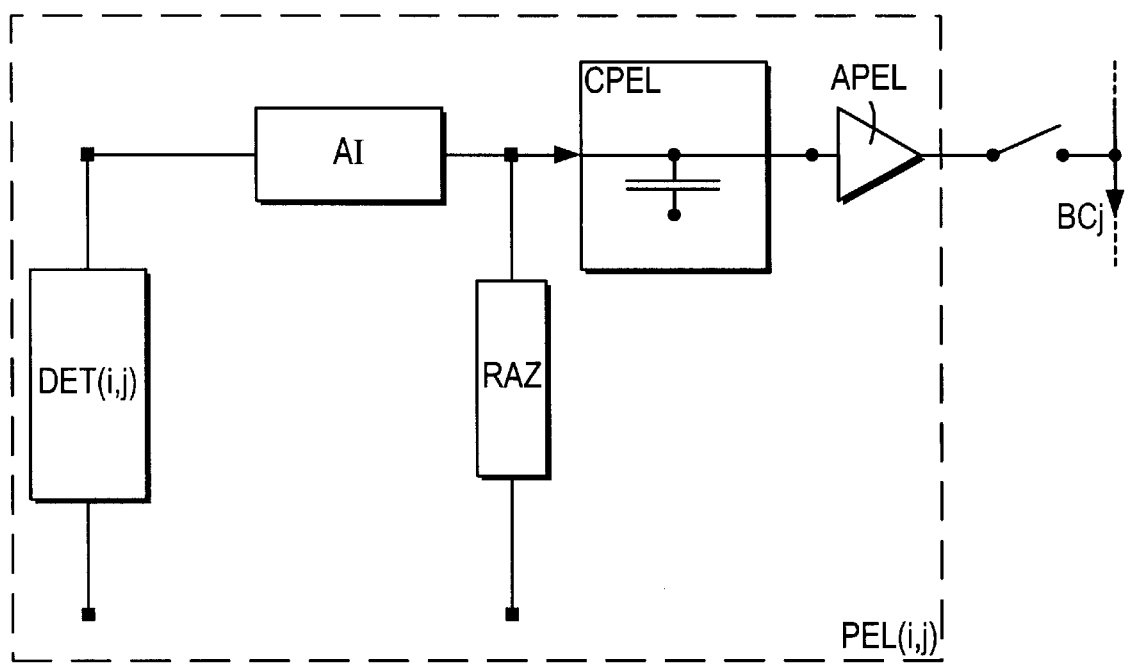
FIGS. 2A and 2B illustrate a read circuit architecture of the prior art of the switched follower type.
Figure 2B:
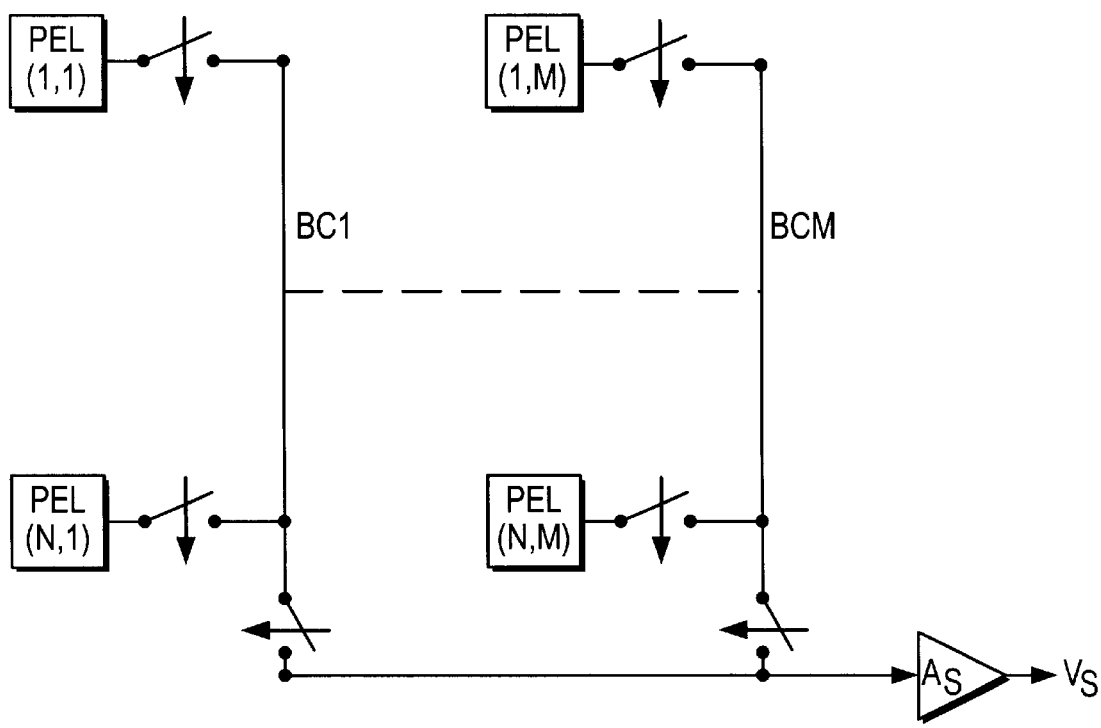
Figure 3A:
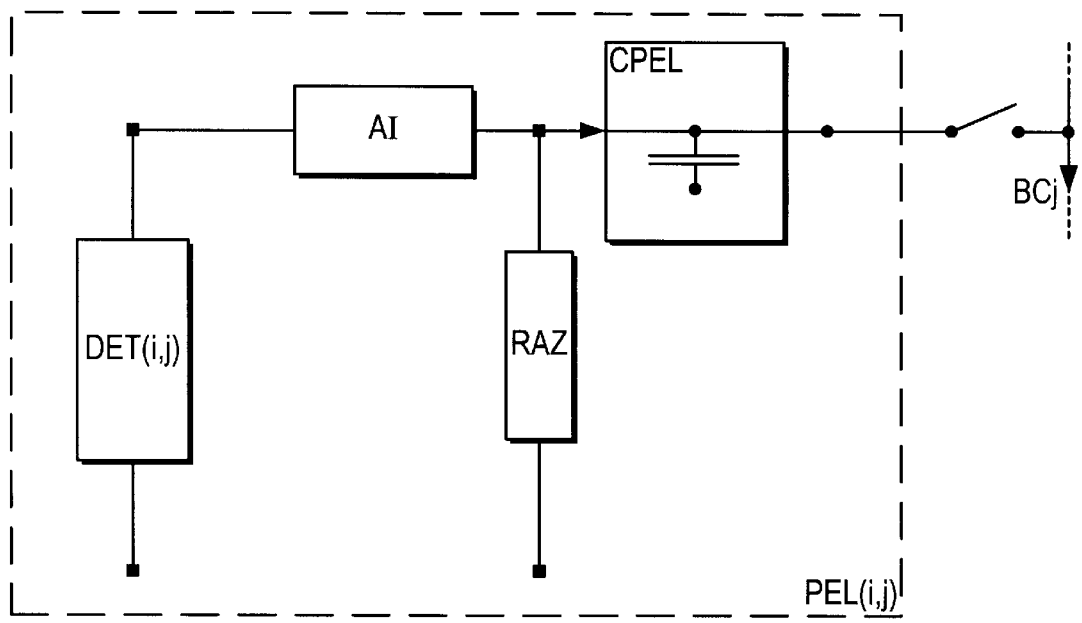
FIGS. 3A and 3B illustrate a read circuit architecture of the prior art of the column bus partition type.
Figure 3B:
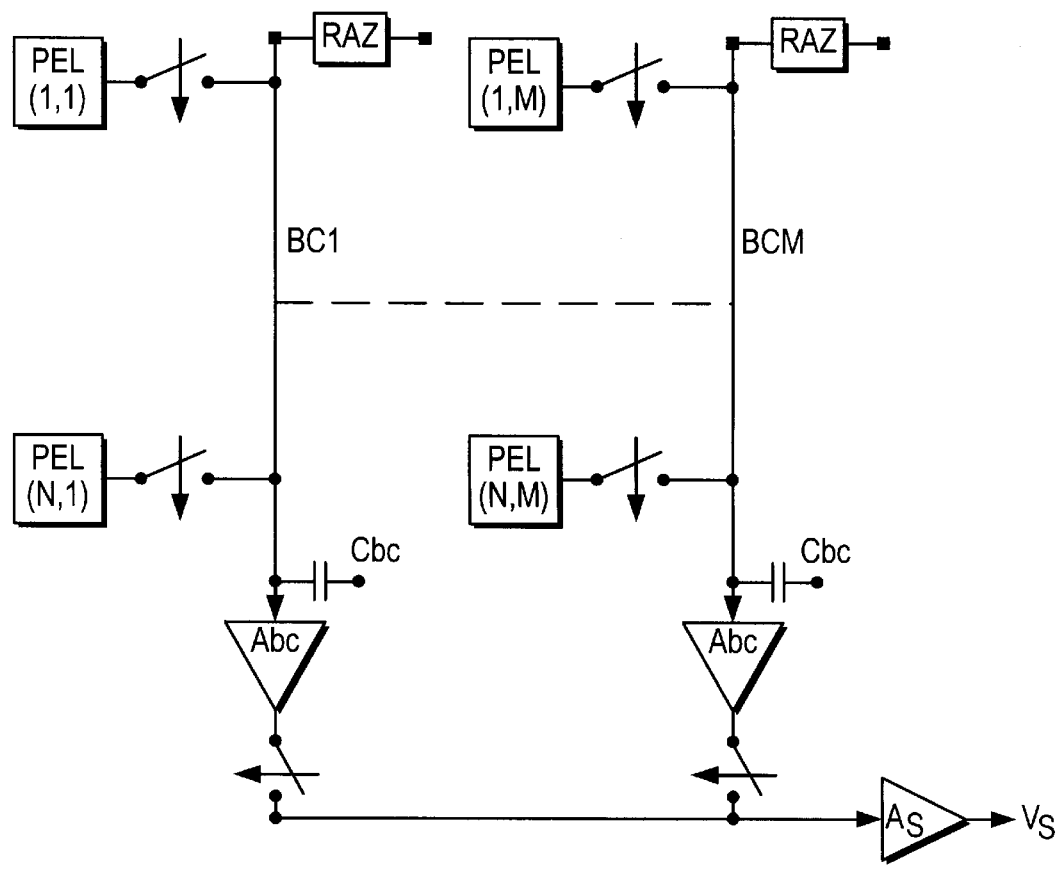
Figure 4A:
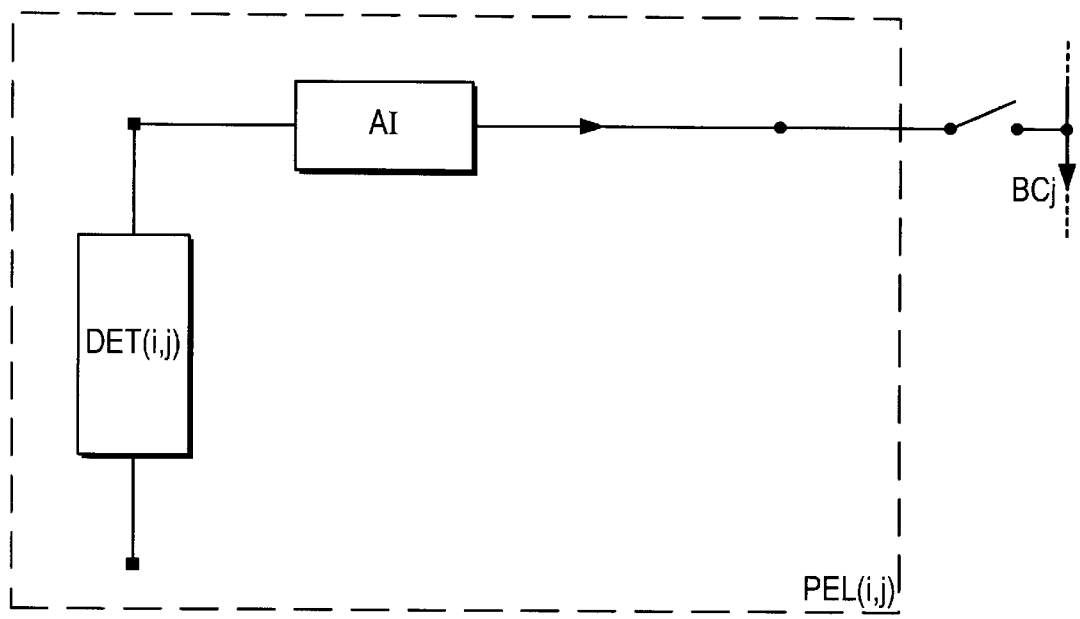
FIGS. 4A and 4B illustrate a read circuit architecture of the prior art of the remote integration type.
Figure 4B:
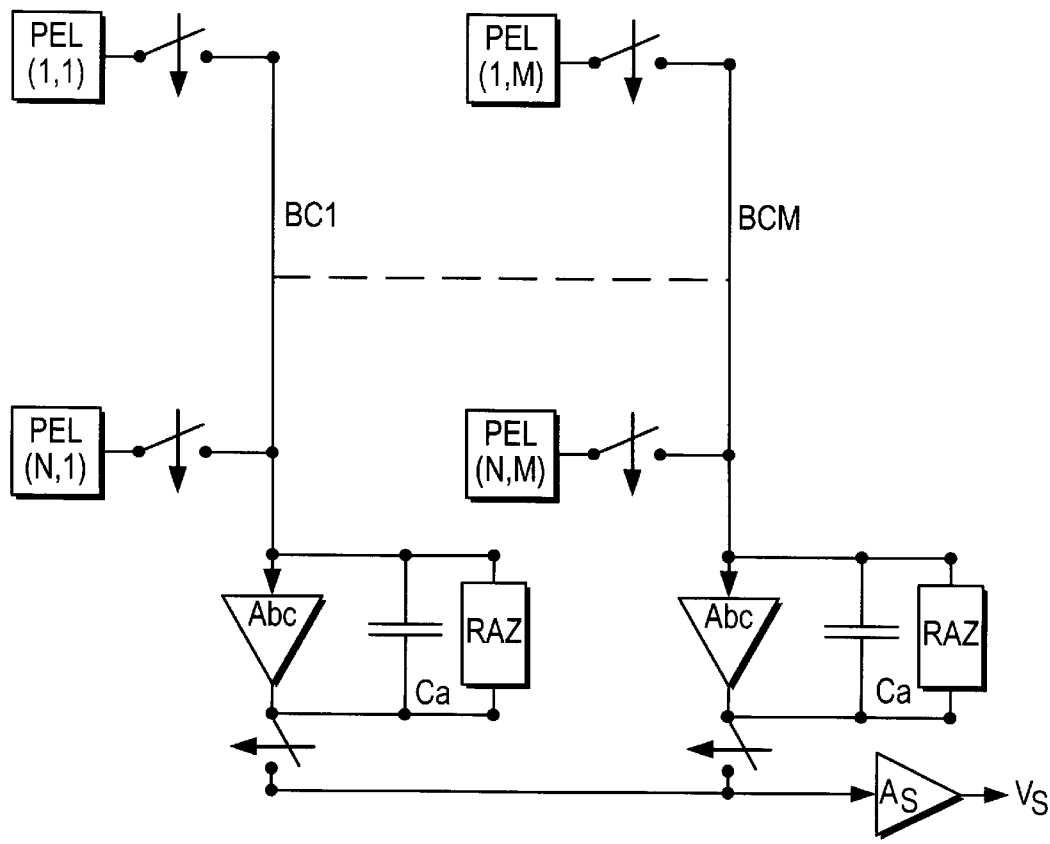
Figure 5:
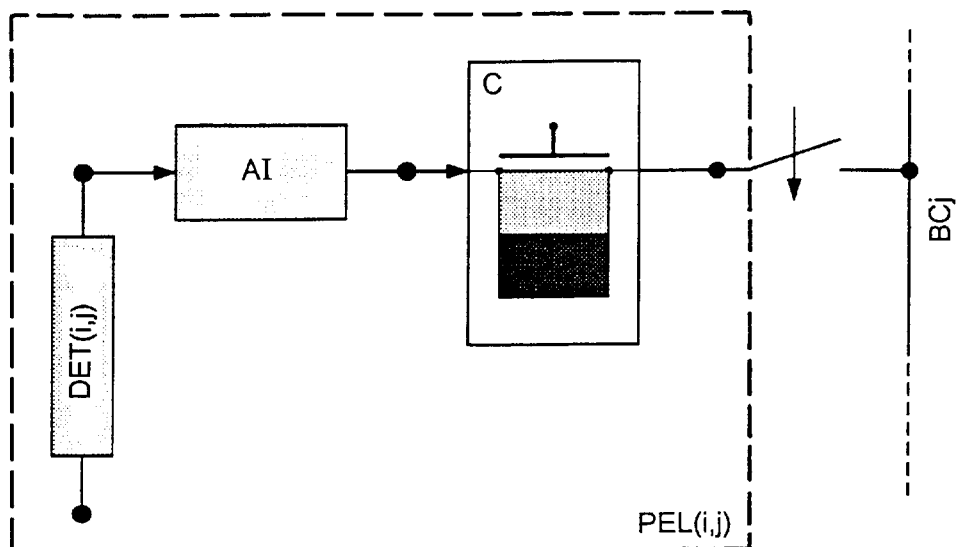
FIGS. 5A and 5B illustrate a read circuit architecture according to the invention.
Figure 5:
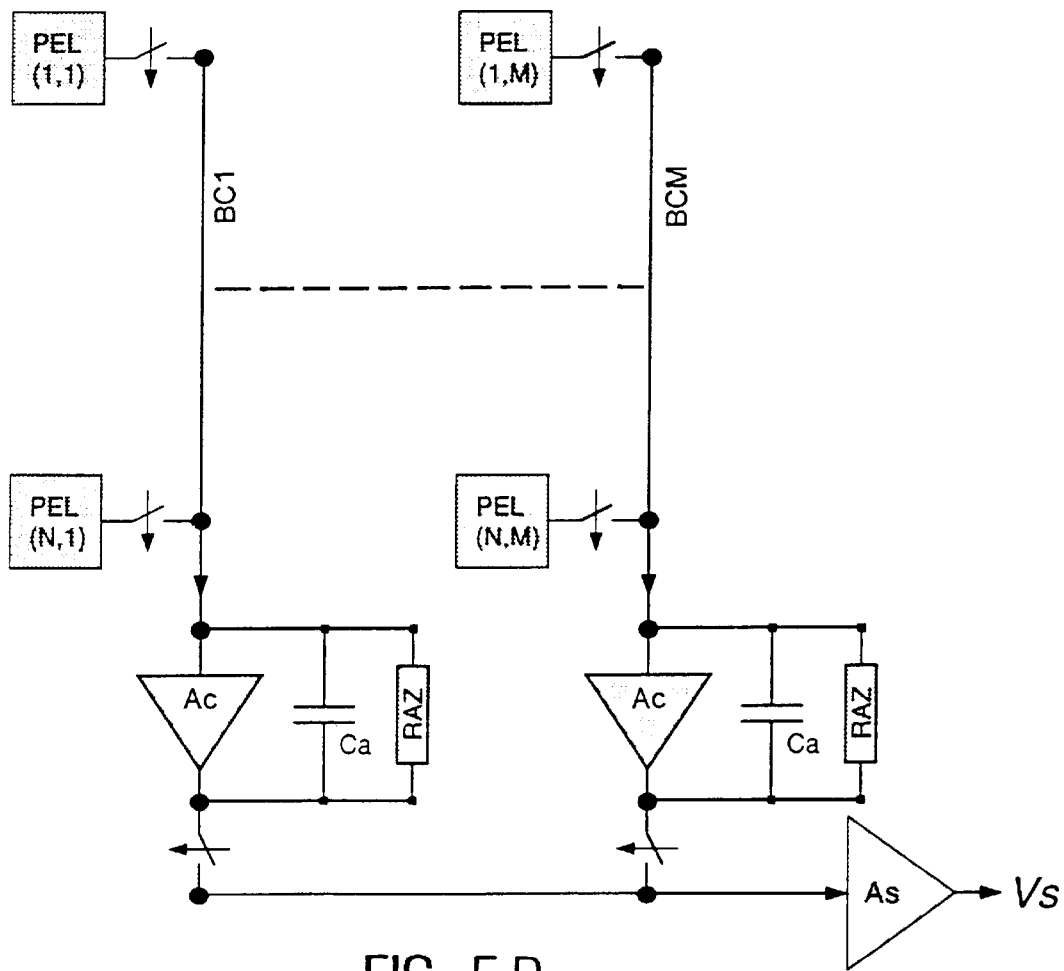

The outline diagram of the elementary point proposed is depicted in FIGS. 5A and 5B.

There are found in this:

an impedance matching device AI between a detector DET(i,j) and a device for integrating, storing and discharging a charge;

the integration and storage device Cpel implemented for example by means of an MOS transistor whose source and/or drain are connected to the detector via the impedance matching device and whose control is controlled by a clock;

an addressing device, represented, for reasons of simplification, by a switch, which makes it possible to switch the source and/or drain of the MOS transistor onto a connection common to the elementary points of one and the same column, referred to as a column bus BCj, for discharging the charges.

A charge amplifier Acj is connected to the end of each column bus BCj. The multiplexing of the charge amplifier outputs to one or more output amplifiers As is effected by means of switches.

At each frame, the switches situated between the detectors and the MOS storage transistor are closed synchronously, the switches situated between the MOS transistors and the column buses BCj being open.

The current delivered by each detector is then integrated in the inversion channel of the MOS transistor for a period Texposure.

At the end of the exposure time, the switches situated between the detectors and the MOS transistors are opened synchronously. This therefore gives the same exposure time for each of the detectors.

The lines of detectors are then selected one after the other. At each line time, the switches in one and the same line situated between the MOS transistors and the column buses are closed. The gate of the MOS transistors in one and the same line is then pulsed so as to cause the injection of the charges stored in its channel onto the column bus and, consequently, the resetting of the charge stored in the inversion channel of the MOS transistor.

The column bus being assumed to be kept at a constant potential by the charge amplifier whose input impedance is also assumed to be infinite, the current pulse thus caused by the injection of charges is converted into a voltage by the charge amplifier. Its output can then be multiplexed to the video output in order to be processed.

It is then possible to reinitialise the charge amplifier, to open the column addressing device and finally to create a new potential well, empty of all charge, underneath the gate of the MOS storage transistor in order to proceed with the reading of the following line.

The expression of the voltage variation $\delta Vc_{ij}$ at the output of the charge amplifier Acj connected to the column j as a function of the current $Id_{ij}$ delivered thereto by the detector of the elementary point PEL(i,j) is given by the expression:

$$\delta Vc_{ij} = Id_{ij} \times \text{Texposure}/Ca$$

where Ca is the capacitance of the feedback capacitor of the charge amplifier.

The capacitance of the column bus does not play any part in the transfer function of this solution since the charge amplifier is assumed to have differential inputs and a nil input current. The column bus being maintained at a constant potential by this amplifier, it does not divert any displacement current. In other words, there is a conservation of the charge in the circuit.

The variation in the output voltage $\delta Vs_{ij}$ corresponding to the reading of the information delivered by the elementary point PEL(i,j) is therefore given by the following equation:

$$\delta Vs_{ij} = As \times \delta Vc_{ij} = As \times Id_{ij} \times \text{Texposure}/Ca$$

where As is the voltage gain of the output voltage amplifier.

This type of snapshot read circuit architecture for a mosaic of quantal detectors and thermal detectors will be designated, in the remainder of the description, by the English acronym "SCA", standing for "Snapshot Charge Amplifier".

Exemplary Embodiment

Figure 6:
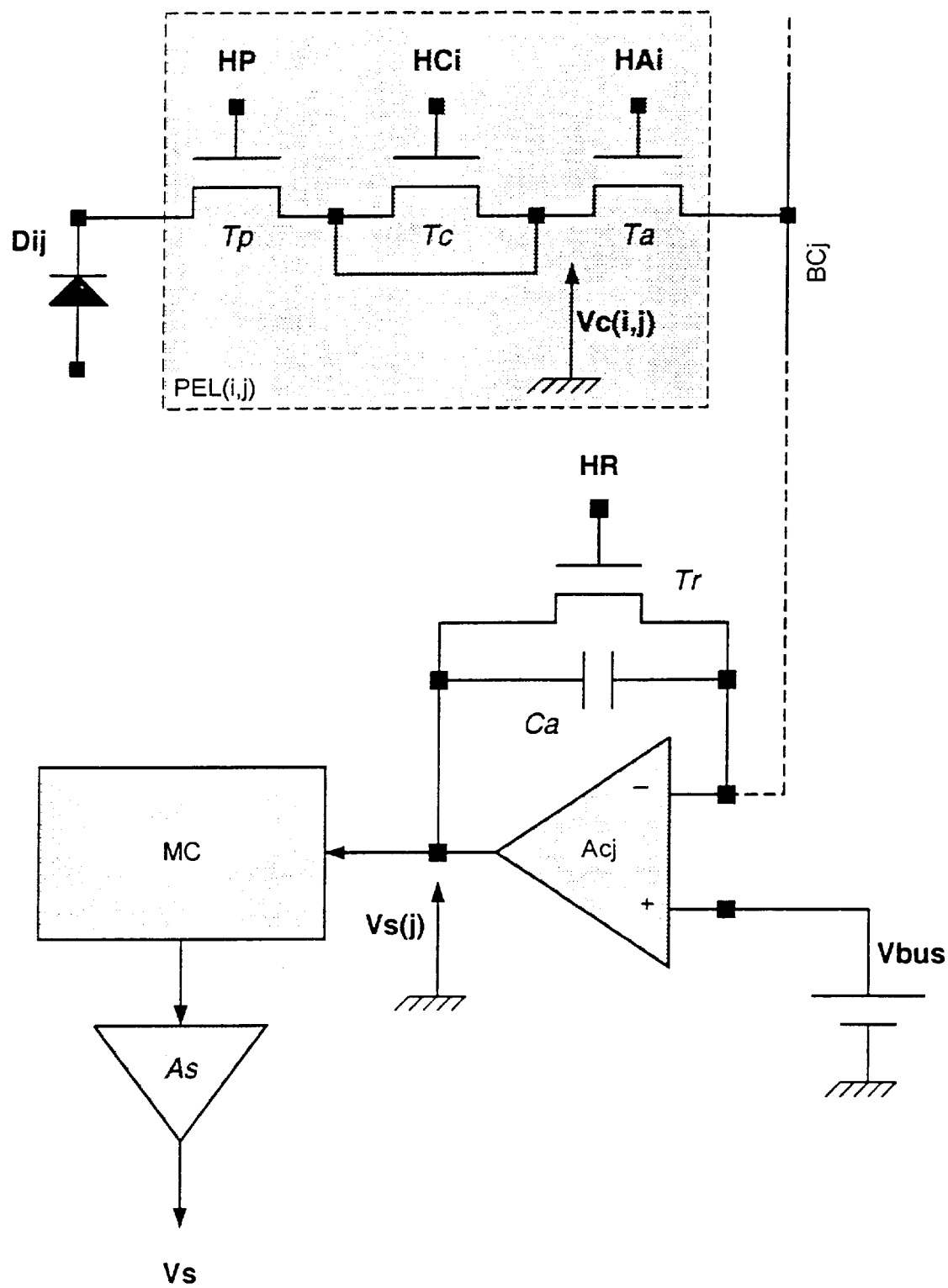
FIG. 6 illustrates the outline electrical diagram of the device of the invention.

The outline diagram of the functions to be installed in a snapshot read circuit for a mosaic of quantal detectors or thermal detectors is given in FIG. 6.

This circuit is assumed to read a matrix of N lines by M columns of detectors. The elementary point PEL(i,j) of line i and column j is depicted therein. Its output drives the column bus BCj, which is connected to a charge amplifier Acj. The outputs of the M charge amplifiers are multiplexed to an output voltage amplifier by means of an M to 1 multiplexer MC.

The detector is assumed to be an n-type photovoltaic detector on a p-type substrate. It is represented by the diode Dij.

For the impedance matching between the detector and the elementary point, an NMOS transistor Tp is here connected in common gate mode, that is to say it has a low input impedance and a very high output impedance. Its source is connected to the detector and its drain to the source of an NMOS integration transistor Tc.

This principle of coupling the photovoltaic detectors to their read circuits is very conventional and is often referred to as direct injection in the literature. There are many variants thereof, intended principally to reduce the input impedance and/or to increase the output impedance.

A clock, designated by HP, is applied to the gate of all the transistors Tp in the mosaic.

The integration function is here performed by means of an NMOS transistor Tc, whose source and drain can be short-circuited, as is the case in the figure.

The source and drain diodes of Tc are connected on the one hand to the drain of Tp and on the other hand to the input diode of the NMOS addressing transistor Ta.

A clock HCi is applied to the gate of Tc. The index i indicates that all the transistors Tc in the same line are driven by this clock and that each line in the read circuit is driven by a different clock.

The NMOS addressing transistor Ta is connected as a switch between the source and drain of Tc and the column bus connection BCj.

A clock HAi is connected to its gate. The index i indicates that this clock drives all the transistors Ta in the line and that each line of the read circuit is driven by a different clock.

With regard to the charge amplifier, the column bus is connected to the inverting input of a differential amplifier Ac with feedback through a capacitor Ca.

The non-inverting input of the charge amplifier is connected to a power supply Vbus.

The transistor Tr is connected in parallel with Ca. It is used as a switch for reinitialising the capacitor Ca between the reading of two consecutive lines. Its gate is controlled by a clock HR.

Functioning of the Elementary Point

Before describing the electrical functioning of an elementary point, it is essential to disclose the principles which govern the sizing of this type of circuit and the adjustment of the different stimuli.

The clocks used to control this circuit are assumed to be switched between two analogue levels which are not always equal to the supply voltages (Vdd, Vss) of the circuits, as is often the practice. By convention, in the remainder of the description, the output voltage of the clocks:

in the high state is denoted H(1);
in the low state is denoted H(0).

The biasing transistor has two functions:
biasing the detector;
controlling the exposure time.

The first function is obtained by applying, to the gate of this NMOS transistor, a voltage such that it is biased in saturation, that is to say in a region where it has a high dynamic drain-source resistance. In the case of the invention, it suffices to apply to the gate of Tp a voltage substantially equal to the threshold voltage Vtn of this MOS transistor.

The second function is obtained by applying to the gate of Tp a voltage such that Tp is off. In the case of the invention, it suffices to apply to the gate of Tp a voltage Vtb which ensures that Tp allows no current to pass, even in low inversion conditions. In practice, it suffices to apply the minimum voltage allowed by the network, designated here by Vss, in order to have a sufficient noise margin.

The biasing transistor therefore fulfils its functions if the clock Hp switches between the following levels:

$HP(1) \approx Vtn$;

$HP(0) = Vtb \approx Vss$.

The MOS integration and storage transistor Tc must be controlled by a clock Hc so that it fulfils the following three functions;

maximising the storable charge;
reinitialising its capacitance between two images;
controlling the current which will be injected into the charge amplifier at each reading.

In the majority of applications, it is desirable to maximise the signal to noise ratio as from the first stage of the read circuit, which in general amounts to maximising the charge storable in the inversion channel of Tc.

To do this, it suffices to apply to the gate of Tc the maximum voltage allowed by the network, which will be designated here by Vdd. The maximum storable charge Qsm in the elementary point can then be approximated by the following formula (ignoring the capacitance of the source and drain diodes of Tp, Tc capacitance and to the rate of variation of the falling edge of HCi. The duration of this current pulse is for its part equal to the charge stored divided by its amplitude.

Figure 7:
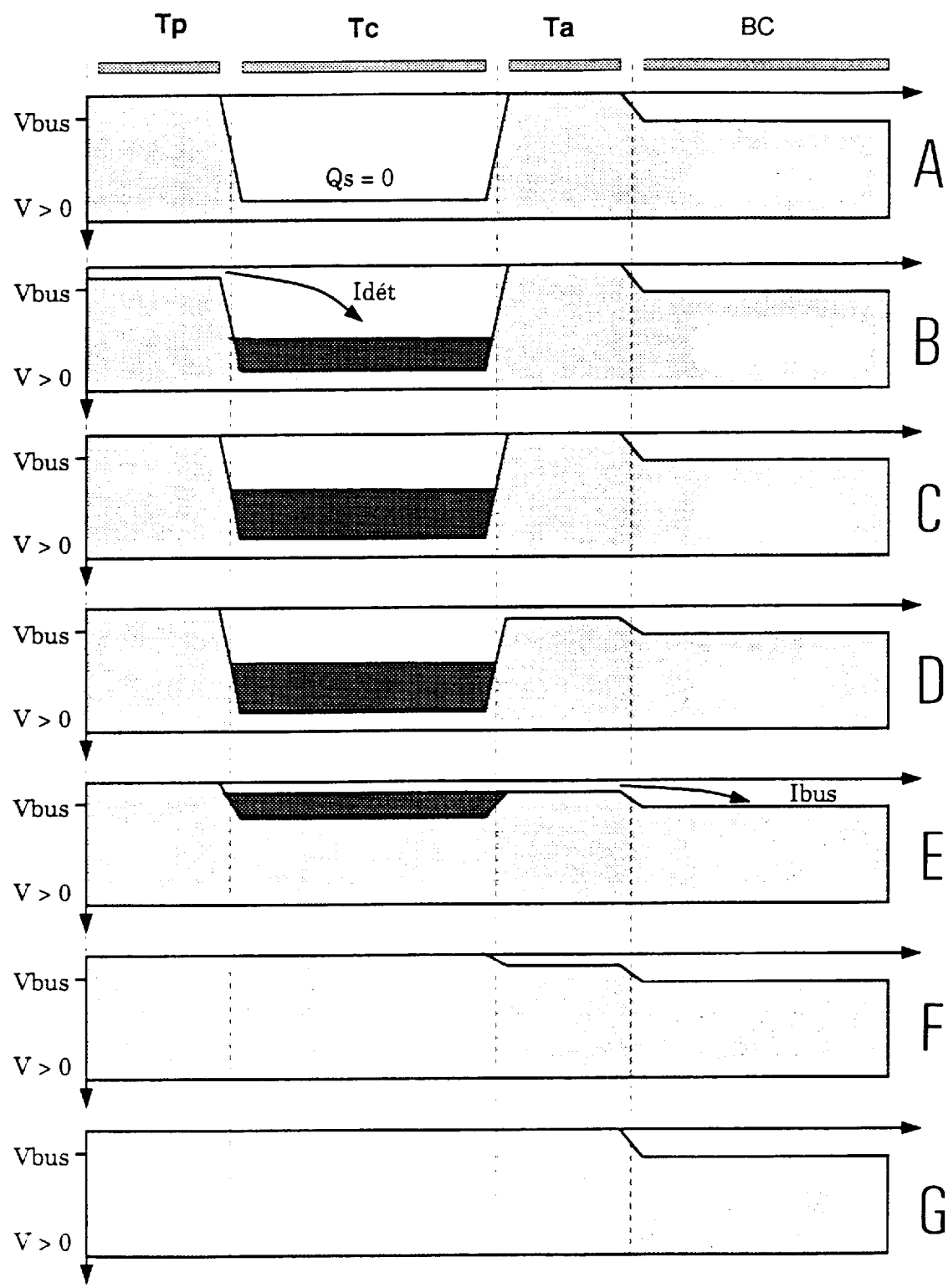
FIG. 7 illustrates the variations during a complete operating cycle of the potential profiles in an elementary point according to the invention.

The variations during the complete operating cycle of the potential profiles in the different MOS transistors of the elementary point are shown diagrammatically in FIG. 7. The operating cycle has been divided therein into seven phases:

Phase A: this phase precedes the exposure time. Tp is off. The potential well under Tc exists, but it is empty. Ta is off.

Phase B: the elementary point is in the course of integration. Tp is conducting. The current output by the detector is integrated in the potential well under Tc.

Phase C: this is the end of the exposure time. Tp is off, which has the effect of sampling and holding the potential under Tc.

Phase D: this is the start of the reading of the elementary point. Only the voltage applied to the gate of Ta is modified so as to make it conducting and to create a potential barrier between Tc and the column bus.

Phase E: the charges stored under Tc have been injected over the potential barrier created under Ta into the potential well of the column bus.

Phase F: all the charges stored under Tc have been injected into the column bus. The potential well under Tc is empty.

Phase G: this is the end of the reading of the elementary point. Ta is off so as to proceed with the reading of another elementary point or else to capture another image.

Figure 8:
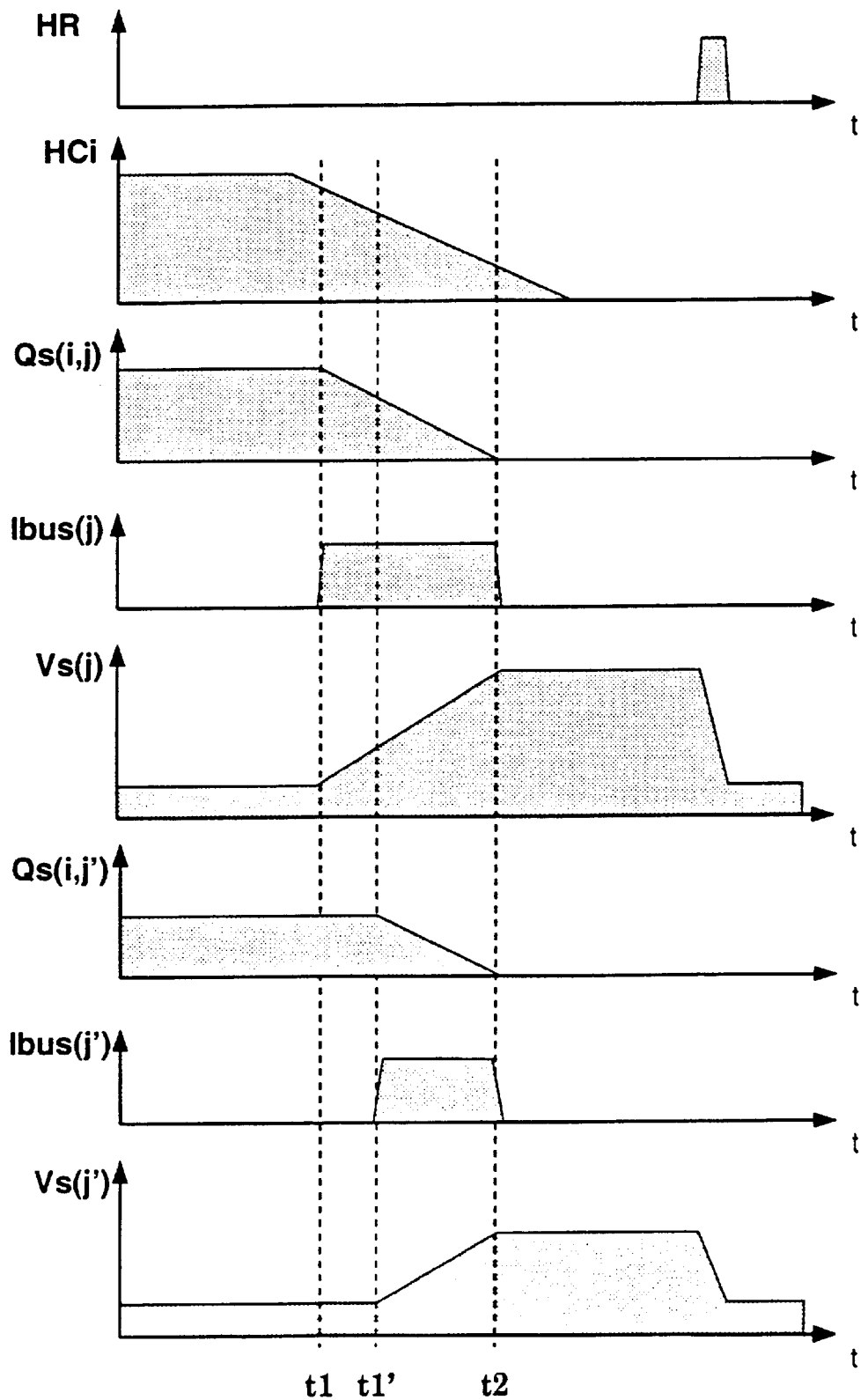
FIG. 8 illustrates a timing diagram for the reading of two elementary points according to the invention.

The curves of FIG. 8 give a better understanding of how certain electrical quantities vary according to the charge stored in the elementary point. To do this, $Qs(i,j)$ and $Qs(i,j')$ designate the charge stored in two elementary points on the same line i, but in two different columns, denoted here j and j', at the end of an exposure time. The voltage applied to the gate of the MOS storage transistors Tc of these two elementary points is designated by HCi. It is assumed that the rate of variation of its falling edge is constant. The currents injected into the buses of columns j and j' are denoted respectively Ibj and Ibj'. The output voltages of the charge amplifiers connected to the column buses j and j' are denoted respectively Vsj and Vsj'.

These curves show that the current injected into the column bus j (or respectively j') becomes non-nil as from a time t1 (or respectively t1'). These curves show clearly that this time varies according to the charge stored since, the lower this charge, the more necessary it is for the channel potential under Tc to fall, under the effect of the decrease in the voltage HCi, so that the charges stored under Tc can cross the potential barrier under Ta.

It is therefore as from times t1 and t1' that the output voltages Vsj and Vsj' begin to increase, and this with an identical variation rate since the intensity of the currents Ibj and Ibj' is identical.

The reading ends in fact, as a first approximation, at the same time t2 for the two elementary points when the last charges stored in the two elementary points are injected into their respective buses. The currents Ibj and Ibj' becoming nil as from time t2, the output voltages Vsj and Vsj' do not change. It is then possible to multiplex them to an output amplifier.

In summary, it can be considered that the invention conditions the current delivered by the quantal detectors and the resistive bolometric detectors in the following manner:
- conversion of the detector current into a charge by integration of a duration equal to the exposure time;
- conversion of the integrated charge into a current pulse whose amplitude is adjustable according to a stimulus (this stimulus can be generated on the read circuit) and whose duration varies according to the charge stored;
- conversion of this current pulse into a voltage by means of an amplifier with feedback through a capacitor.

Functioning of the Read Circuit

Figure 9:
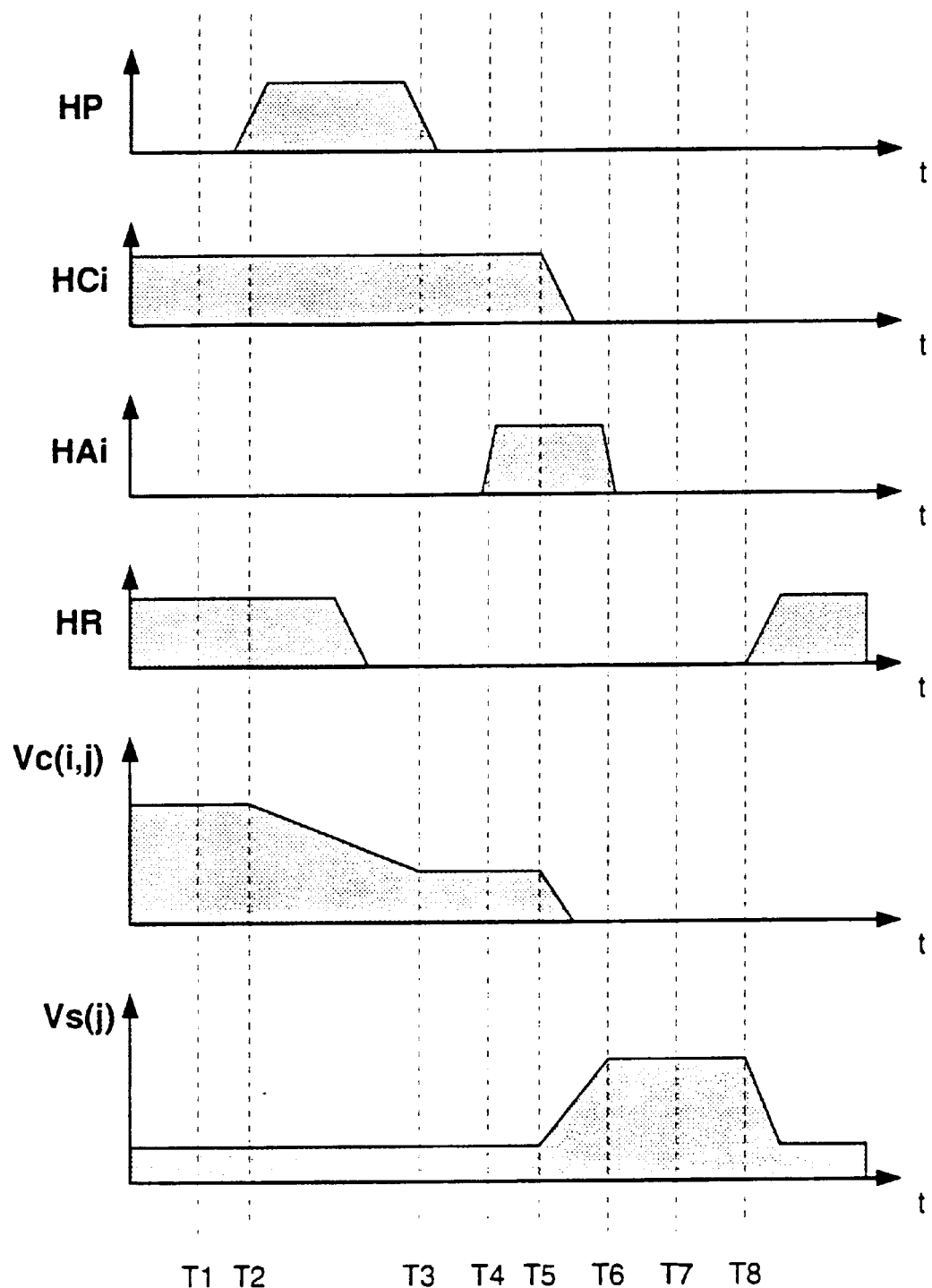
FIG. 9 illustrates the sequencing of the clocks of a read circuit according to the invention.
Figure 10A:
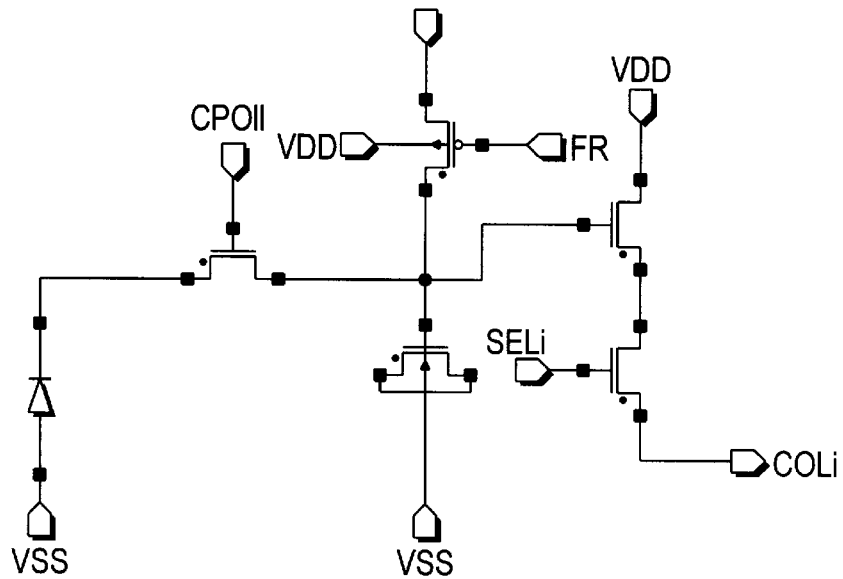
Figure 10B:
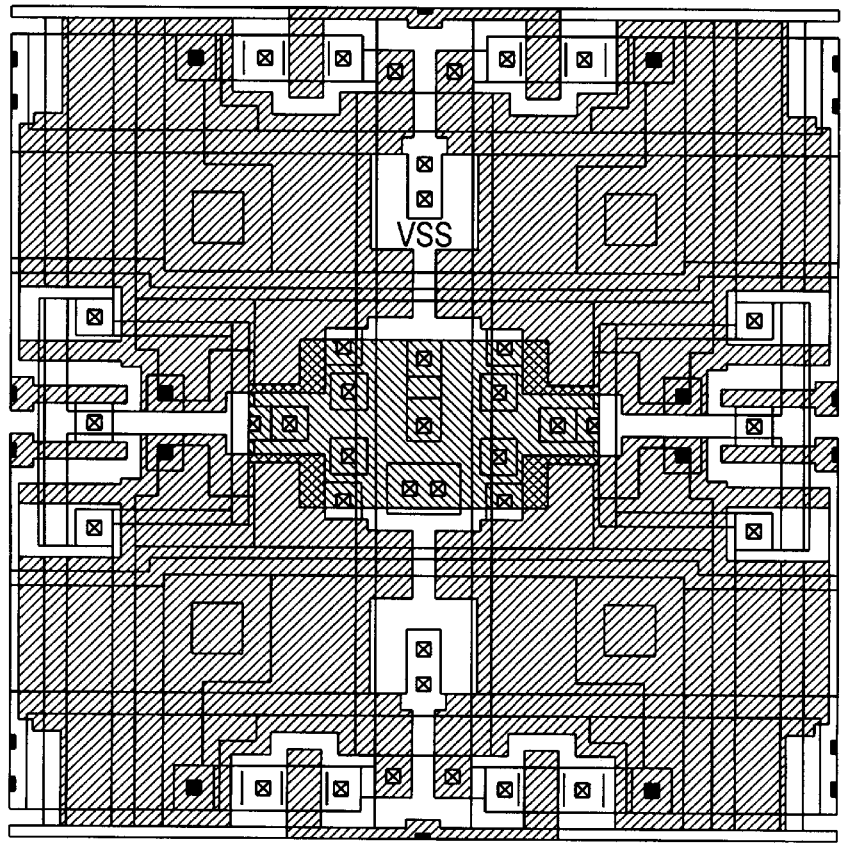

For a description of the functioning of the read circuit, the sequencing of the clocks is illustrated in FIG. 9.

At time t=T1:
the clocks HCi, for i=1 to N, in other words all the gates of the MOS transistors Tc in the mosaic, are at the high state;
the clock HP is assumed to be at the low state, in consequence of which no current enters the elementary point;
the clocks Hai are assumed to be at the low state;
the clock HR is such that Ca is shortcircuited.

At time t=T2:
the clock HP goes to the high state, which suitably biases the detector;
the detector delivers a current which is integrated in the inversion channel of the NMOS transistor Tc;
the voltage Vc(i,j) at the terminals of the integration capacitor decreases over time.

At time t=T3:
the clock HP goes to the low state, which stops the integration;
the exposure time is therefore equal to T3−T2;
it is identical and synchronous for all the elementary points;

it is then possible to proceed with the reading of the charges stored in the elementary points line after line.

At time t=T4:
the clock HAi in the line under consideration goes to the high state.

At time t=T5:
the clock HCi goes to the low state at time T5, its rate of variation per unit time being adapted to the pass band of the charge amplifier;
the charges stored in the elementary point PEL(i,j) are then injected into the charge amplifier connected to the end of the column bus BCj;
the output voltage Vs(j) of the charge amplifier Acj increases.

At time t=T6:
the clock HAi goes to the low state;
the column bus is at high impedance.

At time t=T7:
the output signal of the charge amplifier Acj is established;
this signal is multiplexed to the output amplifier in order to be processed.

At time t=T8:
the charge amplifier is reinitialised;
reading of the following line can commence.

Particular Advantages

Shooting

The solution proposed makes it possible to have an exposure time which is of the same duration and synchronous for all the elementary points, which is not the case with remote integration solutions.

Technological Efficiency, Integration Density, Signal/Noise

The possibility of designing an elementary point with the following characteristics:
a limited number of MOS transistors;
MOS transistors of the same type;
the charges stored in the channel of an MOS transistor significantly improves the technological efficiency since the number of contacts and interconnections in the elementary point decreases significantly for the following reasons:
it is not necessary to interconnect the drain and source of certain MOS transistors of the same type by means of metallic contacts and interconnections since this can be achieved by means of diffusions used for implementing the source and drain diodes;
it is not necessary to comply with the latch-up rules, that is to say to connect the substrate to the power supply Vss and the casing to the power supply Vdd by means of various metallic contacts and interconnections since it is not necessary to install supplementary MOS transistors in the elementary point;
it is not necessary to comply with the rules for spacing between NMOS and PMOS transistors in the elementary point, since it is not necessary to install supplementary MOS transistors in the elementary point;
it is not necessary to install a reset device in the elementary point.

These same technical arguments show that the filling ratio of the elementary point of the solution proposed is greater than or equal to that of other solutions where the current is integrated in the elementary point. In practice, the surface area of the storage capacitor which it is possible to design in the elementary point of the proposed solution is greater (in applications with a reduced pitch, the storage surface area is multiplied by at least a factor of two) than that which it would be possible to design in an architecture of the charge transfer device or switched follower type since the number of MOS transistors to be located therein is smaller. Finally, it can be shown that the potential excursion in the MOS storage transistor is greater than that obtained in an elementary point of the switched follower type.

As a consequence, the storable charge of the proposed solution, and therefore the signal to noise ratio of the circuit, is greater than that which it is possible to achieve by employing the solutions of the prior art, all operational conditions (for example size, pitch of elementary points, temperature, etc) otherwise being equal.

This is illustrated in FIGS. 10A and 10B, and 11A and 11B, where a mosaic of two lines by two columns of elementary points of the switched follower type is compared respectively with a mosaic of the same format of elementary points of the SCA type. The electrical diagrams of the two elementary points are depicted above the layout of these patterns. These two layouts show clearly, for constant design rules, that the layout of the SCA architecture is appreciably more simple than that of the switched follower. A person skilled in the art will note there in particular that the SCA solution is appreciably superior to the switched follower type solution in terms of:

interconnection density;

number of contacts;

filling ratio (active surface area/surface area of the elementary point).

Linearity

The charge integrated in the elementary point is converted into a voltage by the charge amplifier. The linearity is therefore controlled for the most part by the voltage coefficient of the capacitance of the feedback capacitor of the charge amplifier.

This type of specific capacitor is available in the networks developed for implementing circuits of the switched capacitance type.

The transfer function of the proposed solution is therefore much more linear than:

the charge transfer device type circuits, whose transfer efficiency, that is to say the input-output attenuation, depends on the number of transfers and/or the charge to be transferred;

the switched follower type circuits, whose voltage gain is not constant from point to point and/or over their entire input excursion;

the column bus partition type circuits, where the capacitance of the column bus has a high voltage coefficient because of the capacitance of the diodes of the switches which are connected to it, which varies with the quantity of charges read.

Rejection of the Power Supplies and Control Phases

The proposed solution is appreciably superior to that of switched followers since there is no longer any critical power supply in the elementary point, both with regard to the reinitialisation of the elementary point and the power supplies of the follower.

Moreover, the potential of each column bus is kept constant by the charge amplifier whereas in the circuits of the switched follower or column bus partition type this potential varies enormously. This characteristic limits the capacitive couplings between the different functions located in the elementary point. This point is very important since the majority of electrical nodes of the elementary point are at high impedance, and therefore very sensitive, and these couplings will increase as the pitch of the detectors decreases.

Finally, it is important to note that, in an SCA architecture, the storage capacitors are reinitialised line by line, and not simultaneously as in other solutions, which has the effect of minimising current demands in the power supplies, and consequently of relaxing the constraints on the resistances of the supply buses.

Spatial Spread

In the proposed solution, the spread of the parameters of the technology is not critical in the elementary point. It suffices for the charge which can be stored in the storage capacitor to be sufficiently large.

The spatial spread is essentially controlled by the conversion coefficient of the charge amplifiers. There is therefore no spread along one and the same column.

Reading/Writing

The connections, switches and control logic of this architecture ensure electrical continuity, that is to say a connection of finite resistance, between the elementary points of one and the same column and the ends of the bus of the column under consideration.

They therefore make it possible not only to read the information stored in the elementary points but also to address these elementary points individually in order to inject a current and/or a voltage therein. In other words, in comparison with digital memories, this architecture is of the read-write type and not solely of the read type.

Write mode can be used in this case to control certain operators installed in the elementary point so as to modify the transfer function of each elementary point, independently of each other, and this in an adaptive fashion during operation, if necessary.

A read circuit of the so-called "current base removal" type (patent No 88 10375: system for detecting information in the form of electromagnetic radiation and for reading the detected information) can be taken as an example of an application. In this type of circuit, a current is subtracted from that of each detector before integration in the elementary point, which minimises the charge to be stored. This subtraction is performed by means of an MOS transistor operating in saturation. In practice, the base removed current in each elementary point is adjusted by presenting a uniform scene before the detector. This optoelectrical calibration could be replaced by a purely electrical calibration by virtue of the write mode.

Figure 12:
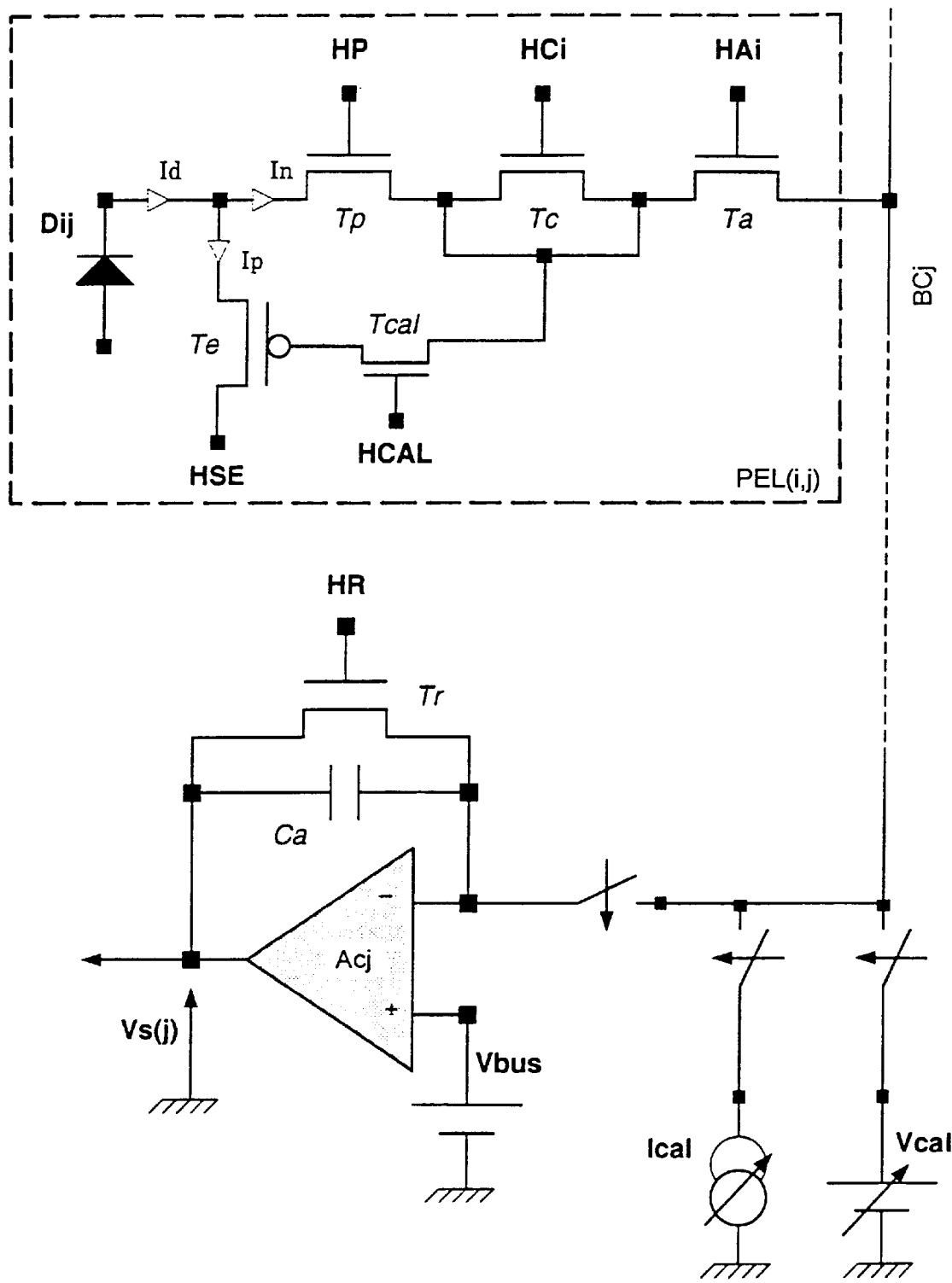
FIG. 12 illustrates the outline electrical calibration diagram according to the invention.

This is because the proposed architecture makes it possible to inject either a current or a voltage into each elementary point. This is illustrated in FIG. 12. The variable current generator (Ical), or the variable voltage source (Vcal), are switched onto the column buses by means of a suitably sequenced demultiplexer. The current which is base removed by the PMOS transistor Te integrated in the elementary point could therefore be adjusted either by copying Ical in Te by means of current mirror techniques or the like, or by sampling and holding on the gate of Te a voltage Vcal such that the base removed current is equal to the required value.

It will therefore be understood that it is possible to carry out calibrations of the circuit by modifying, according to the requirements of the application and independently for each elementary point, the intensity of the base removed current. The potentialities of such a type of calibration are:

reduction or even elimination of the taking of optoelectrical references;

adjustment of the base removed current in each elementary point according to the change in the illumination received by the detection circuit.

The testability of the read circuits designed with a reduced pitch, which is often limited since the introduction of a specific MOS transistor is to the detriment of the charge which can be stored, and therefore the performance of the camera.

In the context of an architecture of the SCA type, it is clear in FIG. 12 that it is possible to inject a voltage and/or a current into the elementary point, which resolves the problem. It is highly possible that it is then necessary to modify the high level applied to the gate of the MOS addressing transistor, but this can be achieved easily by a person skilled in the art.

Multi-Application

In the above, the case of a detector suitable for processing a single wavelength range has been dealt with.

In order to deal with wavelengths in different ranges, it suffices to have one detector per wavelength range. The currents supplied by these different detectors are then by nature different.

Because the MOS transistor situated in the elementary point serves as a reservoir, it is clear that it suffices to size it for the largest detected current in order to have a circuit which is compatible with several applications.

This is because it suffices to design a charge amplifier with several feedback capacitances in order to obtain a circuit which has optimum sensitivity.

Next it is not necessary to modify the electrical characteristics of the differential amplifier, such as its pass band, for slightly different applications since it is possible to adjust the intensity of the current injected into the column bus, by means of the rate of variation of the fall time of the clock HCi. It is therefore possible to cause the charge amplifier to operate at a constant output signal variation rate whereas the current output by the detector can vary within a very wide range.

Figure 13:
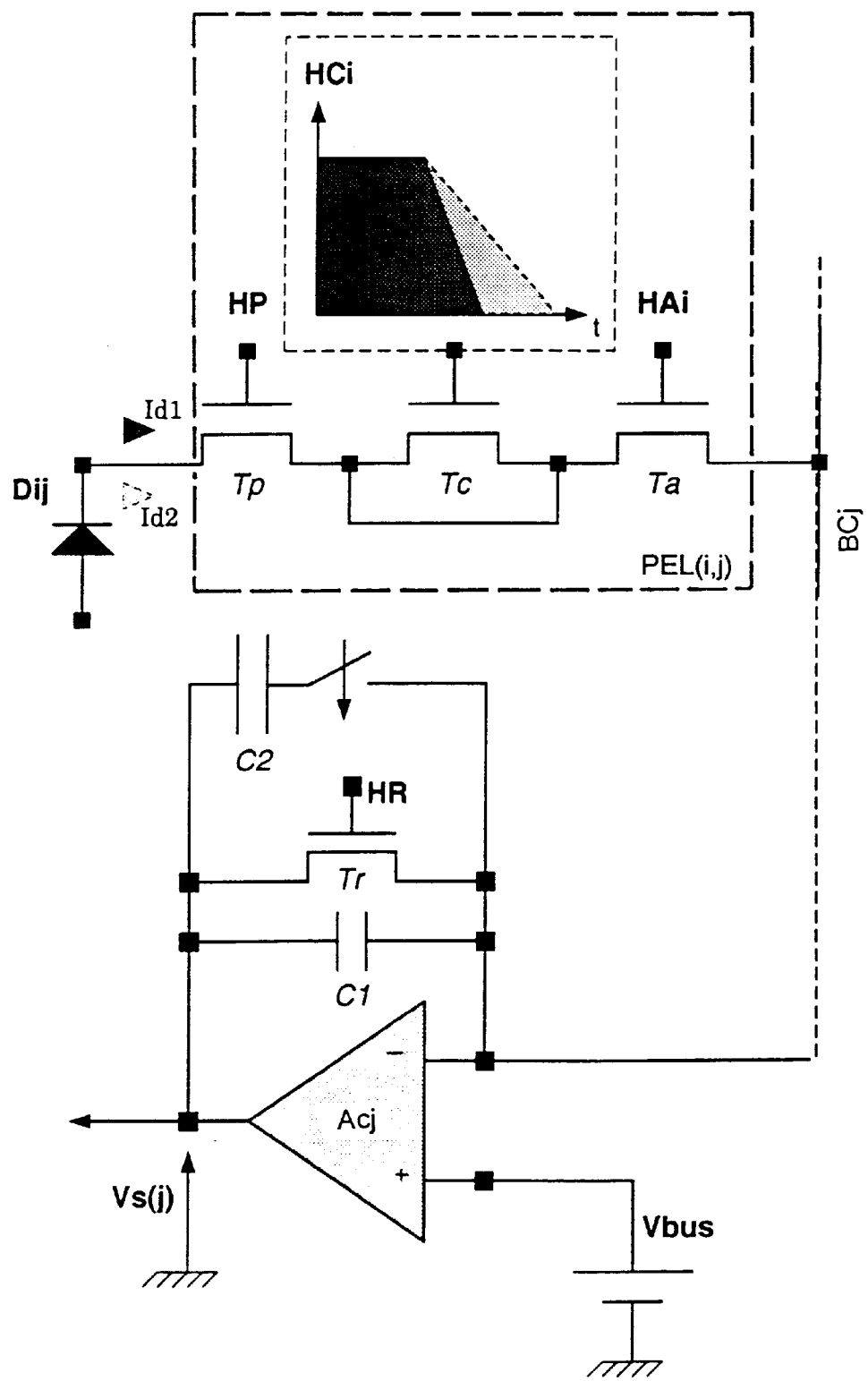
FIG. 13 illustrates the outline diagram of a multi-application circuit.

The outline diagram of such a circuit is depicted in FIG. 13. The capacitor C2 can be put in parallel with the capacitor C1 by closing the switch HCAL, which makes it possible to have two charge-voltage conversion rates. As for the clock HC, it is easy to modify its falling edge variation rate, either by using an adjustable external signal generator or by generating it on the read circuit by means of techniques known to persons skilled in the art.

It therefore turns out that the SCA type architecture is versatile. This is not the case with solutions of the charge transfer device type and column bus partition solutions, which must always be used with the same level of charges. Nor is it the case with switched followers, since, although it is potentially possible to install several capacitors in this type of elementary point, it turns out that this cannot generally be achieved because of lack of space.

Scanned Linear Arrays with TDI Reading

There exists a category of camera where the image is formed by optically scanning a mosaic of detectors. The number of lines in this mosaic is a function of the format of the image and its number of columns is such that it makes it possible to improve the signal to noise ratio of the camera. This is achieved by summing at delayed and synchronous instants (this mode of reading information is referred to as "Time Delay Integration" in the literature in English) of the optical scanning of the information delivered by the detectors of one and the same line in the mosaic.

The SCA type architecture is a potential solution to the problem of reading this type of mosaic, especially when the number of columns and the pitch of the detectors are small.

This is because, in a read circuit of this type, the current from the detectors is first of all transformed into a charge, in the pitch of the detectors if necessary.

It is then possible, by suitably sequencing the clocks connected to the gates of the storage capacitors, to read the charges stored in the elementary points in a line by injecting them successively, that is to say column by column, onto the same line bus.

The TDI effect is finally obtained by judiciously multiplexing these current pulses to integrators. The latter convert the current pulse into a charge and add this charge to the previously integrated charge. They therefore deliver as an output a voltage proportional to the sum of the currents output by the detectors in the line at shifted times.

The number of integrators and their reinitialisation frequency is a function of the number of columns and other characteristics of the camera.

Figure 14:
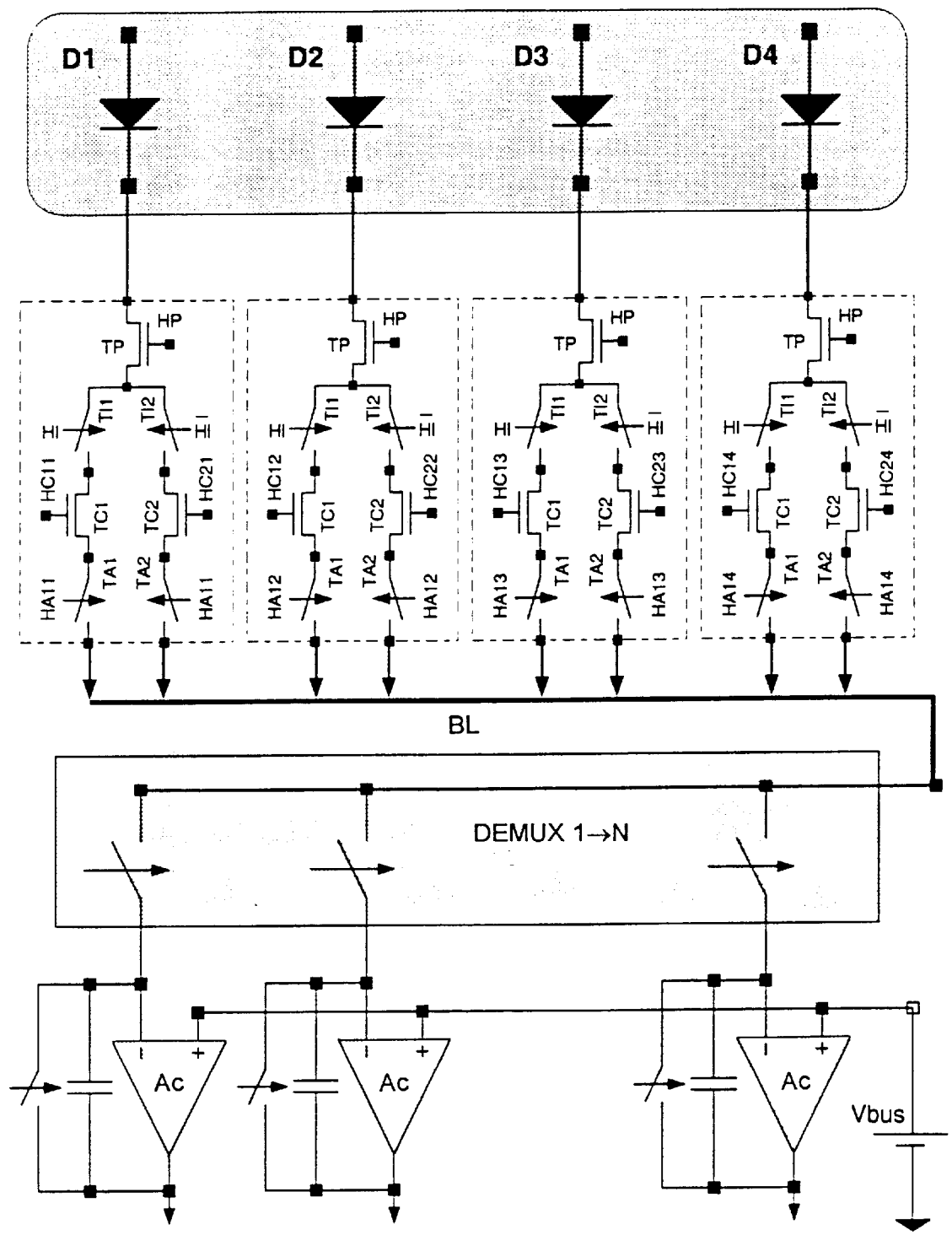
FIG. 14 illustrates the outline diagram of a read circuit of the TDI type according to the invention.

The outline diagram of a read circuit of the TDI type in SCA architecture is given in FIG. 14. It is assumed therein that it is necessary to perform the TDI reading of a line of four photovoltaic detectors (D1 to D4).

Each of the four detectors is coupled to the read circuit direct injection-wise by means of a transistor Tp. The drain of Tp is connected to two integration capacitors TC1 and TC2 via two switches TI1 and TI2. The source-drain diodes of TC1 (or respectively TC2) are connected to the line bus via a switch TA1 (or respectively TA2). One end of the line bus is connected to the input of a demultiplexer, whose outputs are connected to the N charge amplifiers Ac necessary for the envisaged application.

This circuit functions as follows. At each exposure time, in order not to lose information, the current delivered by the detectors is integrated alternately in TC1 and then in TC2 by suitably sequencing the switches TI1 and TI2. This makes it possible to proceed with the reading of the charges stored in the capacitors TC1 whilst the following image is integrated in TC2.

Thus an interval of time equal to the exposure time is available for multiplexing the charges stored in the four capacitors TC1 on the line bus, and demultiplexing the current pulses, induced on the line bus by the injection of these charges, to the charge amplifiers, so as to synthesize the delayed summing transfer function.

The majority of the read circuits of the TDI type are implemented in a CCD ("Charge Coupled Device") network. They give satisfactory results, but the availability of these networks and their integration densities pose problems, especially if it is wished to implement a TDI on a large number of columns and in a small pitch.

There exist circuits of the TDI type implemented in a CMOS network, but in the majority of cases it proves necessary to convert therein the charge stored in the elementary point into a voltage so as to be able to multiplex it on a line bus and to be able to add this voltage to the previous samples by means of integrators, implemented in techniques which are similar to those of switched capacitances. This type of analogue processing chain is therefore of lower performance than an SCA type architecture in terms of bulk, power consumption and linearity since it requires more critical analogue functions.

The read circuits of the scanned linear array type with TDI reading implemented in a CCD network and those implemented in conventional CMOS architectures therefore suffer from the same limitations as their homologues designed for reading non-scanned detector mosaics.

The read circuits of the TDI type therefore form part of the field of application of the SCA architecture for the same reasons as the read circuits previously disclosed.

Industrial Applications

A potential application of the type of architecture proposed is the production of circuits adapted to the reading of the information delivered by quantal detectors and resistive bolometric detectors arranged in a matrix, essentially when the use requires an identical and synchronous exposure time for all the detectors.

Through its design, this circuit is particularly versatile. In other words, one and the same read circuit can be used for relatively different applications, which reduces the development cost and production cost.

This type of read circuit does not require a specific network. Quite the contrary, it is based on analogue networks developed for signal processing.

The increase in the filling ratio of the elementary point makes it possible to develop, using currently used networks, imagers which are of higher performance in terms of:

storable charge, for a given pitch;

supplementary functions (as examples of functions it is possible to cite current base removal, reduction in the input impedance, increase in the input pass band. The devices to be installed for synthesising these functions are known to persons skilled in the art) installed in the elementary point, with a given pitch and storable charge;

reduced pitch, for a given storable charge.

The architecture proposed is compatible with a random addressing of the elementary points. It therefore makes it possible to produce one or more sub-images within the image. It is clear that, in view of the versatility of the circuit, it makes it possible to modify the exposure time and/or the output frequency of the sub-images, whilst keeping an optimum signal to noise ratio.

In certain applications, the cameras can be subjected to a counter-measure such as laser dazzling. In the case of attack by a pulsed laser, the SCA architecture can be used as a counter-measure by using the fact that it can adapt very easily to two very different exposure times, whilst keeping its sensitivity. This is because, by changing the exposure time on the read circuit in a more or less random fashion, it is possible to continue to see the target between two pulses. This can be envisaged with the proposed architecture since it suffices to size the storage capacitor for the worst case scenario and the sizes of the charge amplifiers so that they compensate for the variations in the exposure time.

Finally, this circuit affords a solution to the reading of detection circuits of the multicolour type. This is because the detectors of these circuits have the particularity of delivering a different current according to the spectral range which they detect. It is then clear that it suffices to have as many suitably sequenced MOS transistors in the elementary point and two different ratings on the charge amplifier as there are wavelength ranges detected in order to have a read circuit whose signal to noise ratio is at an optimum in the different spectra. The outline diagram of such a circuit is that of FIG. 13.

The following articles contain subject matter of interest to the general field of the present invention and the contents thereof are incorporated herein by reference:

[1] "256×256 PACE-1 PV HgCdTe focal plane arrays for medium and short wavelength infrared applications" by L. J. Kozlowski, K. Vural, V. H. Johnson, J. K. Chen, R. B. Bailey and D. Bui; and by M. J. Gubala and J. R. Teague (SPIE Vol. 1308 Infrared Detectors and Focal Plane Arrays, 1990).

[2] "Status and direction of PACE-I HgCdTe FPAs for astronomy" by L. J. Kozlowski, K. Vural, D. Q. Bui, R. B. Bailey, D. E. Cooper and D. M. Stephenson (SPIE Vol. 1946 Infrared Detectors and instrumentation, 1993).

[3] "Evaluation of the SBRC 256×256 InSb focal plane array and preliminary specifications for the 1024×1024 InSb focal plane array" by A. M. Fowler and J. Heynssens (SPIE Vol. 1946 Infrared Detectors and Instrumentation, 1993)

[4] "p-channel MIS double-metal process InSb monolithic unit cell for infra-red imaging" by A. Kepten, Y. Shacham-Diamand and S. E. Schacham (SPIE Vol. 1685 Infrared Detectors and Focal Plane Arrays 11, 1992)

[5] "Practical design considerations in achieving high performance from infrared hybrid focal plane arrays" by R. A. Ballingall and I. D. Blenkinsop; and by I. M Baker and J. Parsons (SPIE Vol. 819 Infrared Technology XIII, 1987).

[6] "High-performance 5-$\mu$m 640×480 HgCdTe-on-sapphire focal plane arrays" by L. J Kozlowski, R. B. Bailey, S. A. Cabelli, D. E. Cooper, I. S. Gergis, A. Chi-yi Chen, W. V. McLevige, G. L Bostrup, K. Vural, W. E. Tennant, and by P. E Howard (Optical Engineering 33(1), 54–63, January 1994)

What is claimed is:

1. A device for reading a matrix of photonic detectors, which delivers a current whose intensity varies according to the incident flux, the exposure time being identical and synchronous for all the detectors, said device comprising a set of elementary points (PEL(i,j)) for reading the signals delivered by each detector, the quantity processed being the charge, each elementary point effecting a preintegration of the current delivered by a corresponding detector, and a charge amplifier effecting a reading so as to condition the signals delivered by the matrix of detectors and to multiplex them to at least one information processing chain, and in that each elementary point (PEL(i,j)) comprises:

an impedance matching device (AI; Tp);

an integration and storage device (Cpel; Tc); and an addressing device (Ta).

2. A device as claimed in claim 1, wherein the photonic detectors are quantal detectors.

3. A device as claimed in claim 1, wherein the photonic detectors are thermal detectors.

4. A device as claimed in claim 1, wherein the detectors are produced on a substrate other than said reading device.

5. A device as claimed in claim 1, wherein the detectors are produced directly on the circuit of the reading device.

6. A device as claimed in claim 1, wherein the impedance matching device is arranged between the detector under consideration and the integration and storage device.

7. A device as claimed in claim 6, wherein the integration and storage device is implemented by means of at least one MOS transistor whose source and/or drain are connected to the detector via a switch and whose gate is controlled by a clock.

8. A device as claimed in claim 7, wherein the addressing device is adapted to switch the source and/or drain of the MOS transistor onto a connection common to the elementary points of one and the same column, referred to as a column bus.

9. A device as claimed in claim 8, wherein the charge amplifier is connected to the end of each column bus, and the multiplexing of the outputs of the charge amplifiers to at least one output amplifier (Ap) is effected by means of at least one switch.

10. A device as claimed in claim 7, wherein the impedance matching device is an MOS transistor (Tp).

11. A device as claimed in claim 10, wherein the addressing device is a second MOS transistor used as a switch and having a first threshold voltage, means for applying a high analogue level voltage to the gate of the second MOS transistor at a value slightly higher than the threshold voltage of this second transistor.

12. A device as claimed in claim 11, wherein—the impedance matching device is provided with a first clock, able to bias the corresponding detector and to read the current supplied by this detector;

each second MOS transistor is provided with a second clock able to integrate the current supplied by the detector and associated with an addressing device, to store the charge obtained;

the addressing device, comprising line buses and column buses, is provided with a third clock, able to switch the source and/or drain of the second MOS transistor onto a common connection of the elementary points of one and the same column each of said clocks being switchable between a high state and a low state; and the charge amplifier is able to read the charge synchronously for each line, the lines being read one after the other.

13. A device as claimed in claim 12, wherein the impedance matching device is connected by its source to the detector, by its drain to the source and/or drain of the second MOS transistor and by its gate to the first clock which switches between earth and a biasing voltage;

the gate of the second MOS transistor is connected to the second clock, which switches between earth and a voltage which enables the stored charge to be discharged onto a common connection;

the addressing device is connected, by its source, to the source or drain of the second MOS transistor, by its drain to the column bus and by its gate to the third clock, which switches the gate between earth and the high state of the third clock;

the charge amplifier is connected to the addressing device and to the column bus.

14. A device as claimed in claim 10, wherein the addressing device is an MOS transistor (Ta).

15. A device as claimed in claim 1, wherein the integration and storage device is an MOS transistor having a clock signal applied to its gate and the time for establishing an output signal of the charge amplifier of the elementary point is less than the fall time of the clock signal which controls the gate of the transistor.

16. A device as claimed in claim 1, wherein, in the case of a linear array of detectors, there is no common connection, and there are as many charge amplifiers as there are lines in the array, the multiplexing being limited to the multiplexing of the charge amplifiers.

17. A device as claimed in claim 1, wherein a column bus is provided as a connection common to the element and points and the charge amplifier (Ac) comprises:

an input preamplifier;

a feedback capacitor whose capacitance is equal to the maximum charge to be read divided by the output voltage excursion of the amplifier;

a differential amplifier whose gain x band product is adapted to the rise time of the current pulse which is injected into the column bus.

18. A method of reading a matrix of photonic detectors, which delivers a current whose intensity varies according to the incident flux, comprising the following steps:

a first step of converting the current of the detector into a charge by integration of a duration equal to the exposure time;

a second step of converting the integrated charge into a current pulse whose amplitude is adjustable according to a stimulus and whose duration varies according to the stored charge;

a third step of converting this current pulse into a voltage by means of an amplifier with feedback through a capacitance a fourth step of integrating the current supplied by the detector in a storage device for a time predefined according to desired conditions, the characteristics of the detector and the value of the storage capacitance;

a fifth step of scanning the lines of said matrix by discharging the charges for each line of the matrix; and when all the lines have been scanned, repeating said first through fifth steps as desired.

* * * * *

UNITED STATES PATENT AND TRADEMARK OFFICE
CERTIFICATE OF CORRECTION

PATENT NO. : 6,201,248 B1
DATED : March 13, 2001
INVENTOR(S) : Dominque Marion, Eric Mottin, Philippe Pantigny It is certified that error appears in the above-identified patent and that said Letters Patent is hereby corrected as shown below:

Title page,

Column 2,
Line 13, it should read -- (74) Attorney, Agent or Firm - Anderson, Kill & Olick, P.C. --

Signed and Sealed this

Twenty-eighth Day of August, 2001

Attest:

*Nicholas P. Godici*

*Attesting Officer*

NICHOLAS P. GODICI
*Acting Director of the United States Patent and Trademark Office*